US008852695B2

(12) United States Patent
Huang et al.

(10) Patent No.: US 8,852,695 B2
(45) Date of Patent: Oct. 7, 2014

(54) OPTICAL BARRIERS, WAVEGUIDES, AND METHODS FOR FABRICATING BARRIERS AND WAVEGUIDES FOR USE IN HARSH ENVIRONMENTS

(75) Inventors: Mengbing Huang, Schenectady, NY (US); William T. Spratt, Albany, NY (US)

(73) Assignee: The Research Foundation for The State University of New York, Albany, NY (US)

( * ) Notice: Subject to any disclaimer, the term of this patent is extended or adjusted under 35 U.S.C. 154(b) by 116 days.

(21) Appl. No.: 13/608,118

(22) Filed: Sep. 10, 2012

(65) Prior Publication Data

US 2014/0070119 A1 Mar. 13, 2014

(51) Int. Cl.
*C23C 14/48* (2006.01)
(52) U.S. Cl.
USPC ........................................... 427/523; 427/526
(58) Field of Classification Search
CPC ............................ G01K 11/125; H01L 21/268
USPC ..................... 438/46, 93, 795, 796
See application file for complete search history.

(56) References Cited

U.S. PATENT DOCUMENTS

| 4,305,803 | A | * | 12/1981 | Beyer et al. | 204/426 |
|---|---|---|---|---|---|
| 4,840,446 | A | * | 6/1989 | Nakamura et al. | 385/131 |
| 4,923,278 | A | * | 5/1990 | Kashyap et al. | 385/128 |
| 6,159,553 | A | * | 12/2000 | Li et al. | 427/452 |
| 6,450,116 | B1 | * | 9/2002 | Noble et al. | 118/723 R |
| 6,968,114 | B2 | | 11/2005 | Janney et al. | |
| 7,507,667 | B2 | * | 3/2009 | Yoo | 438/687 |
| 7,951,632 | B1 | * | 5/2011 | Quick et al. | 438/46 |
| 2002/0073925 | A1 | * | 6/2002 | Noble et al. | 118/723 ME |
| 2010/0178723 | A1 | * | 7/2010 | Henley | 438/71 |
| 2011/0211249 | A1 | * | 9/2011 | Quick et al. | 359/315 |
| 2012/0058624 | A1 | * | 3/2012 | Henley | 438/463 |
| 2012/0064655 | A1 | * | 3/2012 | Quick et al. | 438/49 |
| 2013/0062593 | A1 | * | 3/2013 | Jones et al. | 257/21 |

OTHER PUBLICATIONS

Kostritskii, et al. "Specific behavior of refractive indices in low-dose He+-implanted LiNbO3 waveguides," Journal of Applied Physics, 101, 094109 (2007).
Kucheyev, et al. "Blistering of H-implanted GaN," Journal of Applied Physics, vol. 91, No. 6 Mar. 15, 2002.
Laversenne, et al. "Designable buried waveguides in sapphire by proton implantation," Applied Physics Letters, vol. 85, No. 22, Nov. 29, 2004.

(Continued)

*Primary Examiner* — Nikita Wells
*Assistant Examiner* — Johnnie L Smith
(74) *Attorney, Agent, or Firm* — Tech Valley Patent, LLC; John Pietrangelo

(57) ABSTRACT

Electromagnetic radiation barriers and waveguides, including barriers and waveguides for light, are disclosed. The barriers and waveguides are fabricated by directing charged particles, for example, ions, into crystalline substrates, for example, single-crystal sapphire substrates, to modify the crystal structure and produce a region of varying refractive index. These substrates are then heated to temperatures greater than 200 degrees C. to stabilize the modified crystal structure and provide the barrier to electromagnetic radiation. Since the treatment stabilizes the crystal structure at elevated temperature, for example, above 500 degrees C. or above 1000 degrees C., the barriers and waveguides disclosed are uniquely adapted for use in detecting conditions in harsh environments, for example, at greater than 200 degrees C. Sensors, systems for using sensors, and methods for fabricating barriers and waveguides are also disclosed.

33 Claims, 12 Drawing Sheets

(56) References Cited

OTHER PUBLICATIONS

Maex. et al. "Low dielectric constant materials for microelectronics," Journal of Applied Physics, vol. 93, No. 11, Jun. 1, 2003.

Nubling, et al. "Optical properties of single-crystal sapphire fibers," Applied Optics, vol. 36, No. 24, Aug. 20, 1997.

Raheem-Kizchery, et al. "High Temperature Refractory Coating Materials, for Sapphire Waveguides," SPIE, vol. 1170, Fiber Optic Smart Structures and Skins II (1989).

Saunders, M. J. "Optical fiber profiles using the refracted near-field technique: a comparison with other methods," Applied Optics, vol. 20, No. 9, May 1, 1981.

Singh, et al. "Formation of Nanovoids and Nanocolumns in High Dose Hydrogen Implanted ZnO Bulk Crystals," Materials Reseach Society Symposium Proceedings, vol. 957 ( 2007).

Sladen, et al. "Determination of optical fiber refractive index profiles by a near-field scanning technique," Applied Physics Letters, vol. 28, No. 5, Mar. 1, 1976.

Sun, et al. "Erbium/ytterbium fluorescence based fiber optic temperature sensor system," Review of Scientific Instruments, vol. 71, No. 11, Nov. 2000.

Szachowicz, et al. "Fabrication of H+ implanted channel waveguides in Y3Al5O12:Nd,Tm single crystal buried epitaxial layers . . . ," Applied Physics Letters 90, 031113 (2007).

Terreault, Bernard "Hydrogen blistering of silicon: Progress in fundamental understanding," Physica Status Solida, (a) 204, No. 7, pp. 2129-2184 (2007).

Tong, et al. "Layer splitting process in hydrogen-implanted Si, Ge, SiC, and diamond substrates," Applied Physics Letters 70 (11), Mar. 17, 1997.

Ulrich, et al. "Measurement of Thin Film Parameters with a Prism Coupler," Applied Optics, vol. 12, No. 12, Dec. 1973.

Wang, et al. "Sapphire-fiber-based intrinsic Fabry-Perot interferometer," Optics Letters, vol. 17, No. 14, Jul. 15, 1992.

Wang, et al. "Low-loss planar and stripe waveguides in Nd3+-doped silicate glass produced by oxygen-ion implantation," Journal of Applied Physics, 101, 053112 (2007).

White, et al. "Optical waveguide refractive index profiles determined from measurement of mode indices: a simple analysis," Applied Optics, vol. 15, No. 1, Jan. 1976.

Pedrazzani, Janet Renee "High-Temperature Displacement Sensor Using a White-Light Scanning Fiber Michelson Interferometer," Masters Thesis, Virginia Polytechnic Inst. (1996).

Townsend, et al. "Optical Effects of Ion Implantation," Cambridge University Press, 1994, pp. 196-207.

Chen, et al. "Property investigation of C+-ion-implanted LiNbO3 planar optical waveguides," Journal of Applied Physics 98, 044507 (2005).

Davis, et al. "Fiber Coating Concepts for Brittle-Matrix Composites," Jounral of the American Ceramics Society, 76 [45], pp. 1249-1257 (1993).

Desu, et al. "High Temperature Sapphire Optical Sensor Fiber Coatings," SPIE ,vol. 1307, Electro-Optical Materials for Switches, Coatings, Sensor Optics, and Detectors (1990).

Fernando, et al. "Optical-Fiber Sensors," Materials Research Society (MRS) Bulletin, May 2002, pp. 359-364 (2002).

Grattan, et al. "Optical-FiberSensors:Temperature and Pressure Sensors," Materials Research Society (MRS) Bulletin, May 2002, pp. 389-395 (2002).

Grivas, et al. "Room-temperature continuous-wave operation of Ti:sapphire buried channel-waveguide lasers . . . ," Optics Letters, vol. 31, No. 23, pp. 3450-3452, Dec. 1, 2006.

Hong, et al. "Coarsening model of cavity nucleation and thin film delamination from single-crystal BaTiO3 with proton implantation," Physical Review B 75, 214102 (2007).

Hu, et al. "Monomode optical waveguide in lithium niobate formed MeV Si+ ion implantation," Journal of Applied Physics, vol. 89, No. 9, May 1, 2001.

Huang, et al. "Penetration rate of water insapphire and silicaoptical fibers at elevated temperature and pressure," Optical Engineering, 43(6) pp. 1272-1273 (Jun. 2004).

Jung, et al. "Retention of implanted hydrogen and helium in martensitic stainless steels . . . ," Journal of Nuclear Materials, 296, pp. 165-173 (2001).

\* cited by examiner

OPTICAL BARRIERS, WAVEGUIDES, AND METHODS FOR FABRICATING BARRIERS AND WAVEGUIDES FOR USE IN HARSH ENVIRONMENTS

FEDERALLY FUNDED RESEARCH

The invention described herein was made with U.S. Government support under Federal Grant Number CMMI-0926141 awarded by the National Science Foundation (NSF). The U.S. Government has certain rights to this invention.

BACKGROUND OF THE INVENTION

1. Technical Field

The invention disclosed herein relates to optical barriers and waveguides and the fabrication and use of optical barriers and waveguides for transmitting electromagnetic radiation. Specifically, the invention relates to the fiber-optic sensing under harsh conditions and the fabrication of barriers and waveguides by ion implantation and annealing at high temperatures.

2. Description of Related Art

Sensing and/or monitoring of physical parameters (for example, temperature, pressure, etc.) in harsh environments is critically demanded by many industrial applications, including combustion related applications, such as, in power engines, in power plants, in coal gasification, and in chemical synthesis, among others. The temperatures in such environments typically exceed 1000 degrees C., and in, for example, combustion related applications, high gas pressures and highly reactive chemical species are also involved. The ability for real-time sensing of various physical parameters throughout the combustion systems (for example, in turbine engines) is often essential for gaining an understanding of the system's performance and behaviors, so that further improvements in system performance can be made. In addition, the ability for real-time sensing of the conditions within such processes can provide a means for providing early warning or diagnosis of potential problems in such systems.

Many industrial applications, such as, power engines, power plants, coal gasification and chemical synthesis, among others, are based on combustion processes. To ensure high efficiencies of these applications, it is often necessary to monitor various physical parameters characterizing the combustion processes. Among such parameters, the temporal variation and spatial distribution of temperature over the combustion zones during combustion is particularly important for understanding and controlling combustion processes. The extreme harsh conditions encountered in combustion, typically concerning high temperatures, high gas pressures and high chemical corrosion, have posed great challenges in the sensing and/or monitoring of combustion processes.

Fiber-optics-based sensing technology is particularly attractive for harsh environment sensing. As known in the art, fiber optics sensing is characterized by the transmission of electromagnetic radiation, in particular, light, through a waveguide, for example, a fiber, by the phenomenon of total internal reflection. Compared to other technologies, fiber-optics-based sensors offer many unique advantages, for example, enabling real-time, multi-location monitoring and/or measurement of a wide range of physical and chemical parameters. Unlike silica fibers, which become softened at temperatures at around 800 degrees C., sapphire optical fibers, for example, single-crystal-sapphire optical fibers, can withstand much higher temperatures, for example, exceeding 1000 degrees C. or more. Accordingly, sapphire optical fibers are recognized as sensing material that can be used for optical sensing at temperatures exceeding 1000 degrees C.

However, a major obstacle to the practical implementation of sapphire-based fibers for sensing in harsh environment is the substantial loss of optical signal typically experienced with sapphire fibers. For example, due to the recognized lack of reliable sapphire fiber claddings that are thermally, chemically, and mechanically stable under harsh conditions, the implementation of sapphire-based optical fibers is impractical, except under the most limited environmental conditions. Aspects of the present invention overcome this and other disadvantages of the existing fiber optic sensing.

The challenges associated with harsh-environment sensing can be exemplified in the case of development of next-generation coal gasification technology, as described, for example, by the U.S. Department of Energy (DOE) at http://www.fossil.energy.gov/programs/powersystems/gasification/index.html] and by Higman, et al. (2003). During gasification processes, coal, petroleum, or virtually any carbon-based feed stock in it raw form is broken down into the basic chemical constituents, producing a mixture of carbon monoxide, hydrogen, and other gaseous compounds that can be utilized as fuels or as raw gases for fabrication of valuable chemical products. In a modern gasifier, carbon-containing raw materials are exposed to hot steam and carefully controlled amounts of air or oxygen under high temperatures and pressures. The control of operation temperatures in the gasifier and radiant syngas cooler vessel is often critical for gasification processes. To maximize the efficiency of gasification and to minimize the emission of toxic gases, it is often required to have the real-time temperature distributions within the gasifier. This could be obtained by deploying multiple sensors at various places of the combustion zones and associated components to obtain a real-time 3-dimensional map of the temperature distribution of the system. Typically, the temperatures in the gasifier vary dramatically in a wide range from 500 degrees C. at the syngas cooler to as high as 2000 degrees C. in the combustion zones. These extremely harsh conditions (for example, high temperature, high pressure, and high chemical corrosion) encountered in combustion processes, combined with the desire for real-time monitoring at multiple locations of the combustion system (for example, the length of the combustion zone monitored in the modern gasifiers ranges from 20 to 40 meters [m]) pose a great challenge to existing sensing technologies.

Prior Art Sensing Regimens

As outlined by Nicholas, et al. (2001), conventional methods for temperature detection are based on either the thermoelectric (or Seeback) effect, as in thermocouples, or the thermal radiation effect, as in pyrometers and infrared cameras. As known in the art, the problem associated with thermocouple-based sensing probes is that the sensor performance degrades significantly with time. Moreover, under high-temperature and high-pressure conditions, particularly in the presence of chemically reactive species, the thermoelectric effect of materials can change dramatically due to modification in thermocouple microstructures or/and the formation of insulating layers on thermocouples as a result of slag buildup during combustion processes. These disadvantages of thermocouple-based sensing often result in unreliable temperature sensing or even a complete failure of the thermocouples. In addition, electrical measurements such as thermocouple use should be avoided in situations where the risk of explosion can be potentially high due to electrical sparks.

Regarding the thermal radiation based sensing, despite the advantage of being a non-contact method for temperature measurements, thermal radiation based sensing devices are typically impractical, or even impossible, for large-scale deployment in multi-point sensing applications. Accordingly, the stringent requirements for high temperature sensing under harsh conditions have made the conventional thermoelectric thermal radiation sensing methods inadequate for harsh conditions.

Fiber-Optic Grating Sensors

As a newly emerging technology, fiber-optic sensors have been increasingly used in many industrial applications, for example, as described by Fernando, et al. (2002); Othonos, et al. (1999); Kashyap (1999); Grattan, et al. (1994-2000); Grattan, et al. (2002); Sun, et al. (2000); and Wang, et al. (1992), among others. One important type of fiber-optic sensor is based on the use of "fiber gratings." As known in the art, a fiber grating structure is a dielectric structure having a periodically alternated refractive index. A fiber grating may typically be fabricated within the fiber core region using ultraviolet or near infrared light illumination combined with techniques such as interferometry or phase masks. Depending on sensing needs, fiber grating sensors can be designed with either "long-period gratings" (LPG) or "short-period gratings," which are also referred to as "fiber Bragg gratings" (FBGs). In the case of temperature sensing, FBGs are frequently used.

In temperature sensing with FBGs, the short-period modulation of refractive index results in the reflection of a narrow band of the incident optical field within the fiber, with the strongest interaction or mode coupling occurring at the Bragg wavelength ($\lambda_B$), which is defined as a function of temperature (T) by the Equation 1:

$$\lambda_B(T) = 2n\Lambda(T) \qquad \text{Equation 1.}$$

In Equation 1, $\Lambda(T)$ is the grating pitch size at temperature T and n is the modal index. In FBGs, the thermal effects on fiber properties can lead to variations in the modal index (n), and/or variations in the grating pitch size ($\Lambda(T)$). Therefore, since thermal effects vary the Bragg wavelength, $\lambda_B(T)$, the $\lambda_B(T)$ is dependent on environmental temperatures and FBG fiber gratings can be used for temperature sensing, for example, in harsh conditions.

In a similar fashion, fiber-grating sensors can be designed for pressure and/or strain detection and chemical sensing, since the index (n) and/or the grating pitch size ($\Lambda(T)$) can be varied due to mechanical and chemical interaction between fiber gratings and their sensing surroundings as well.

Compared to conventional sensing methods, fiber-grating-based fiber optics offers unique advantages. For example, fiber-grating-based sensors can be compact, lightweight, and inexpensive to produce. Most importantly, it is easy to multiplex many fiber-grating sensors in a series with a single optical fiber to form distributed sensor arrays for simultaneous sensing at different locations using a single instrument unit. In addition, various types of fiber-grating sensors can be integrated in the same fiber to monitor a variety of physical parameters, including temperatures, pressures, vibration and chemicals. Also, fiber-grating sensors use light as interrogating means and are immune to electromagnetic interference. Moreover, fiber-grating-based sensors can be deployed in places where electrical spark hazards are a concern.

Sapphire-based Sensors

Though silica based fibers can provide effecting sensors, silica-based fibers are not applicable for sensing at ambient temperatures greater than 800 degrees C., because, as noted by Fernando, et al. (2002) and Nubling, et al. (1997), silica-based fibers become softened around 800 degrees C. Since sapphire does not have this limitation, fiber-optics sensors based on sapphire fibers, for example, single-crystal sapphire, have been considered Nubling, et al. (1997) and Pedrazzani (1996) as a promising sensing media for harsh environment sensing.

The thermal properties of single crystal sapphire are very suitable for high temperature sensing. Single crystal sapphire has relatively high thermal conductivity and thermal diffusivity, allowing its temperatures to be rapidly adjusted to the ambient temperatures. The structure of single crystal sapphire is stable up to 1600-1700 degrees C. before it becomes increasingly plastic at temperatures approaching its melting temperature around 2000 degrees C.

Another concern for harsh environment sensing is the chemical reactivity of fiber materials with chemical species present in the sensing environment. Since chemical reactions between fiber materials and their surroundings can substantially change fiber material properties, resulting in severe degradation in sensor performance, and even the complete failure of sensors due to chemical corrosion. For example, silica fibers can be etched off by hydrofluoric acid at room temperature and by other acids like hydrochloric acid and nitric acid at elevated temperatures. However, single crystal sapphire exhibits exceptional chemical inertness and can hardly be attacked by a wide variety of reagents including acids, alkalis, sulfur, and transition metals, even at temperatures greater than 1000 degrees C. In addition, single crystal sapphire has excellent mechanical strength. On the Mohs scale of hardness, which—as known in the art—references the hardness of diamond as 10, the hardness of sapphire is rated at 9. In contrast, the Mohs scale hardness of silica-based glass, from which silica-based fibers are made, is in the range of 4.5-6.5. In addition, sapphire materials also have high resistance to various forms of radiation, including energetic ions, photons (that is, x-rays), and electrons.

Cladding and Sapphire Fibers

Despite its potentials for harsh-environment sensing applications, sapphire-fiber technology is in its infancy compared to the much more mature silica-fiber technology. Table 1 identifies and compares the characteristics of silica and sapphire fibers. Though, as shown in Table 1, sapphire fibers have marked differences in characteristics that suggest sapphire is preferable to silica for harsh environments, the major issue limiting the use of sapphire-based fiber sensors in an industrial setting is the lack of reliable claddings for sapphire fibers, particularly at temperatures above 1000 degrees C.

TABLE 1

Comparison of Silica and Sapphire Fiber Characteristics
(Source: Fernando, et al. (2003))

|  | Refractive index | Young's modulus | Optical attenuation | Reliable cladding | Min. fiber size | Max. fiber length | Max. sensing temperature |
|---|---|---|---|---|---|---|---|
| Silica | 1.46 | 414 GPa | 0.2 dB/m | Yes | <10 μm | >10 km | <800° C. |
| Sapphire | 1.76 | 73 GPa | 1 dB/m | No | >100 μm | <3 m | >1500° C. |

As known in the art, fiber "cladding" is the layer of material of lower refractive index that is typically in intimate contact with a core material of higher refractive index, for example, silica or sapphire. The presence of the cladding causes light to be confined to the core of the fiber by total internal reflection at the boundary between the core and the cladding. ("THE BASICS OF FIBER OPTIC CABLE," http://www.data-connect.com/Fiber_Tutorial.htm, included by reference herein.)

In addition, small size sapphire fibers (that is, having an outside diameter less than 10 micrometers [μm]) are currently unavailable in the field, and thus single-mode optical propagation within sapphire fibers is essentially impossible, which is another drawback for sapphire-based fiber-optics sensing.

As known in the art, the refractive index of fiber claddings should be less than that of the fiber core where light is confined to propagate. Although the refractive index of air is less than that of fiber materials, air cannot serve as an effective cladding for sapphire fibers. Due to the large difference in refractive index between sapphire (~1.76) and air (~1.0), light propagation in sapphire fibers is characterized by very large numerical apertures, high degree of multimode, and high sensitivity to bending. These characteristics of sapphire fibers can cause difficulties for the fabrication and operation of sapphire fiber sensors. Moreover, a further disadvantage of sapphire-fiber-based sensing is that the intensity of optical signals in sapphire fibers can be significantly decreased as a result of strong light scattering at the fiber-air interface, if the fibers are not properly clad. This is particularly severe for sensing applications in harsh environments where constantly varied surrounding atmospheres, deposited dust, and defects (for example, scratches and/or cracks) can develop on the fiber surface, among other places, that can result in unsatisfactory optical signal losses. Accordingly, the use of sapphire-based optical sensors can be impractical, or even substantially impossible, for delivering and detecting optical signals when a large fiber length (that is, greater than 0.5 m) is needed, as in the case of multi-point sensing for oversized facilities, such as, power plants and gasifiers.

In addition, for fiber-optics sensing applications, often the number of optical propagating modes must be minimized. However, the presence of cladding can also affect the number of propagating modes allowable within fibers. For sapphire fibers, the number of allowable propagating modes can be decreased by over 80% when the fibers are properly clad by materials with the refractive index a few percent less than that of sapphire.

Unlike silica-based fibers, core-clad structures for single crystal sapphire fibers are unattainable during their growth. Accordingly, one commonly researched method for sapphire fiber cladding is to coat the fiber surface with a layer of dissimilar material with lower refractive index, as described by Desu, et al. (1990); Raheem-Kizchery, et al. (1989); and Davis, et al. (1993). Many materials, including polycrystalline alumina, metal niobium, silicon carbide and silicon oxynitride, have been tried as coating materials for sapphire. Another cladding method proposed in U.S. Pat. No. 6,968,114 of Janney, et al. is based on chemical reactions between a compound powder (for example, MgO) and the sapphire to convert the surface sapphire into a layer of spinels (for example, MgAl2O4) that could help light propagate in the underlying sapphire fiber core. However, none of these efforts has yielded satisfactory performance for sapphire fiber cladding in harsh environments, particularly at temperatures around and above 1000 degrees C.

In addition to the requirements of possessing a lower refractive index (that is, compared to single-crystal sapphire fibers) and being transparent over the operating optical spectral range, the desired cladding material should match sapphire closely in thermal expansion and conduction properties. For ambient temperatures above 1000 degrees C., even a small difference in such thermal characteristics between sapphire and the cladding material can result in mechanical failures (for example, cracking and/or delamination of the cladding from the fiber surface) of claddings due to stress buildup.

Another important aspect is the chemical stability of cladding materials under high temperature, high pressure, and high chemical corrosion conditions. On one hand it is desired to form strong bonding between sapphire fibers and cladding structures in order to enhance adhesion between them, and on the other hand the cladding layers should remain inert to those active chemical species present in sensing environments, otherwise chemical erosion of claddings would occur during sensing periods.

It is well known in the art that, with the present state of the art, it is very difficult (if not impossible) to obtain a cladding material that satisfies all these stringent requirements that can be used effectively for sapphire fiber cladding, for example, for harsh environment sensing applications. Consequently, the inventors have found that there has been no viable technology available in the art that would allows sapphire fibers to be properly clad for use under harsh-environment conditions, for example, involving high temperatures (for example, greater than 1000 degrees C.) and resistance to high chemical corrosion and/or erosion.

Modification of Refractive Index

As is known in the art, the dielectric constant of a material has three components, that is, 1) the electronic polarization, 2) the distortion polarization, and 3) the orientation polarization. The displacement of bound electrons or constituent ions in the presence of an external electric field is responsible for the electronic polarization or the distortion polarization, respectively. The orientation polarization results from electric field induced motion of the molecular units.

At the optical frequency and beyond, only the electronic polarization contributes to the dielectric constant since the other two types of motion cannot vary in time with the electric field. At such high frequency, the refractive index (n) can be related to the dielectric constant ($\in$) in a simple way, that is, by Equation 2, $$\in = n^2 \quad \text{Equation 2}$$

As known in the art, for example, as described by Maex, et al. (2003), Equation 2 yields the "Lorenz-Lorentz" (L-L) equation, that is, Equation 3.

$$\frac{n^2-1}{n^2+2} = \frac{4\pi}{3}\rho\alpha \quad \text{Equation 3}$$

In Equation 3, ρ is the "atomic concentration" and α is the "molecular electronic polarizability." The Lorenz-Lorentz equation (that is, Equation 3) suggests that the refractive index (n) of a material can be reduced by decreasing the atomic concentration (ρ) and/or by decreasing the molecular electronic polarizability (α). As known in the art, the electronic polarizability (α) depends on the chemical bonding of the material, and a dramatic reduction in the electronic polarizability is typically difficult to achieve without significant change of constituting chemical species in the material matrix. However, the effect of atomic concentration (ρ) on the refractive index (n) can be relatively easier to realize, since it is possible to vary a material's atomic concentration by modifying its structural properties. For example, the introduction of pores or voids in the material can lower the local density at the pore or void locations and the atomic concentration ($\rho$) and, therefore, the refractive index (n) at these locations.

Ion Beam Modification of Refractive Index

Ion implantation has been established as a very powerful method for modifying the optical properties in materials, for example, as reported by Townsend, et al. (1994). During ion implantation, energetic ions (that is, ions having a typical energy spanning from a few hundreds of kilo-electron-volts [keV] to tens of million electron-volts [MeV]) are typically impinging on a material. During this impingement, various ion-solid interactions take place as the energetic ions traverse the material, and typically lead to modifications in material properties.

As understood in the art, in the early stage of ion impingement, that is, when the energetic ions pass across the surface region of the material, interactions between incident ions and target electrons contribute overwhelmingly to the energy loss of the ions. As a result of energy transfer to target electrons, atomic excitation and ionization occur in the near surface region, causing changes in a material's bonding structures (for example, rearranging or breaking of chemical bonds). Near the end of the projected ion range in the material, the ion energy is significantly reduced to about tens of keV. At such low energy regimes, it is understood that incident ions lose their energy mainly by colliding with the target nuclei. These nuclear collisions displace the constituent atoms from their original locations, leaving a high density of defects (for example, voids, vacancies, and/or interstitials) in the material. As the incident ions finally settle down in the material, additional changes in the electronic structure and defect formation, for example, due to chemical bonding between implanted impurities and their surroundings, can be induced in the material depending on the implanted ion species and the target material.

The resulting modifications in material properties, including local atomic concentration, defect formation, chemical bonding arrangements, and electronic environments, can have a profound effect upon the optical properties of ion implanted materials. For example, it is well documented in the art that ion implantation can be used for tailoring the profile of refractive index in many materials to fabricate planar optical waveguides, for example, see Townsend, et al. (1994); Laversenne, et al. (2004); Kostritskii, et al. (2007); Wang, et al. (2007); Szachowicz, et al. (2007); and Chen, et al. (2005).

Compared to other techniques, the ion implantation method has many unique advantages. For example, the location and the width of the optical confinement region can be precisely controlled by varying the ion implantation conditions. In addition, ion implantation can allow optical waveguides to be made deep below the surface, ensuring a good mechanical, chemical and thermal reliability of the device. This is of particular importance for applications under harsh conditions.

Ion implantation can produce both positive and negative variations in refractive index. Typically, implantation of heavy ions (for example, silicon [Si]) results in increased index of refraction in the implanted regions, as noted by Townsend, et al. (2004) and by Hu, et al. (2001), while light ions (for example, hydrogen [H] or helium [He]) implantation tends to decrease the refractive index in the implanted region, as reported by Townsend, et al. (1994) and Laversenne, et al. (2004). Compared to the case for heavy ions, the defect production rate for light ions in materials is much lower and therefore the use of light ion implantation is very attractive for fabrication of buried waveguides in materials.

The particular structural modifications induced by light ion implantation in crystals, as reported by Terreault (2007), are responsible for the reduction of refractive index in the implanted regions. Ion species like H or He are insoluble in crystals, and when incorporated in crystals, they tend to accumulate preferentially at sites of defects (typically at vacancy-type defects), leading to the formation of molecular (for example, $H_2$) or monoatomic (for example, He) gas phases in the crystals. The high pressure buildup associated with the resultant gas states in the crystal matric can result in a volume expansion or a decrease in the local atomic density and a decrease in the local atomic concentration ($\rho$), and, correspondingly, a decrease in the refractive index ($\rho$) according to the Lorenz-Lorentz equation shown in Equation 3. The formation of gas phases is believed to be significantly accelerated during post-implantation thermal annealing. However, above certain temperatures, the formed gases can be completely driven out, leaving behind a band of voids or cavities of nanometer [nm] scale size (for example, 1-100 nm) in the materials. The density and the size of these voids are dependent on annealing conditions (for example, temperature and time). As expected from the Lorenz-Lorentz equation (Equation 3), the refractive index (n) in the region containing the voids and/or cavities would be further decreased due to lower local atomic density. Formation of submicron-sized void/cavity in crystals due to hydrogen or helium ion implantation has been reported for various materials from elemental semiconductor crystals like Si, to compound ionic crystals like GaN and ZnO, see Terreault, et al. (2007); Tong, et al. (1997); Hong, et al. (2007); Kucheyev, et al. (2002); and Singh, et al. (2007). Once formed in materials, such cavities/voids can even survive the harsh conditions (for example, high temperatures, pressures, etc.) encountered in nuclear reactors. For example, a notorious example is the embrittlement of reactor materials due to formation of voids following prolonged exposure to energetic protons or helium ions released from nuclear reactions, as described by Jung, et al. (2001).

There have been several investigations on the use of H or He ion implantation for fabrication of buried planar waveguides in optical materials, including LiNbO3 [Laversenne, et al. (2004)], Y3Al5O12 [Szachowicz, et al. (2007)] and Al2O3 (sapphire) [Townsend, et al. (1994) and Grivas, et al. (2006)] crystals. A common feature for these prior art waveguides is that light is confined deep below the surface by an optical barrier produced by H or He ion implantation. As an example, Laversenne, et al. (2004) recently demonstrated, the use of 0.4-1.5 MeV protons to achieve buried planar waveguides with good performance in sapphire crystals.

However, the present inventors have found that this prior art has been limited to room temperature or relatively low processing temperatures conditions for the fabrication and operation of ion implantation produced waveguides, specifically to processing temperatures less than 200 degrees C. Accordingly, the prior art teachings, waveguides, and barriers are not applicable to conditions for higher temperatures, for example, temperatures greater than 200 degrees C., that is, those temperatures that characterize the harsh environments typically encountered in certain industrial processes, as discussed above. Aspects of the present invention overcome this and other disadvantages of the prior art that, among other things, provide waveguides and barriers that can be used effectively in harsh environments, that is, where the prior art waveguides cannot.

SUMMARY OF THE INVENTION

The present invention, in its several embodiments and many aspects, provides an innovative approach to overcoming the major bottleneck in prior art optical sensing, that is, the lack of reliable embedded cladding structures for fiber-type waveguides, for example, single-crystal sapphire fiber-type waveguides, in the implementation of fiber-optics sensing technology in harsh environments. Aspects of the present invention are based upon the use of charged particle implantation, for example, hydrogen ion implantation, combined with high temperature annealing to induce structural modifications (for example, local volume/density, stoichiometry and chemical bonding) in produce barriers to electromagnetic radiation in substrates, for example, thermally, mechanically and chemically stable barriers to electromagnetic radiation. According to aspects of the invention, methods and apparatus are provided which can provide such barriers and waveguides, for example, having varying barrier depth profiles of refractive index that form embedded optical barriers in planar substrates or optical cladding in fibers.

One embodiment of the invention is a method of fabricating an electromagnetic radiation barrier, the method comprising or including directing a stream of charged particles into a substrate, the substrate at least partially transparent to the electromagnetic radiation, the charged particles modifying a crystal structure beneath a surface of the substrate; and heating the substrate to a temperature greater than 200 degrees C. wherein the charged-particle-modified crystal structure is annealed and provides a barrier to passage of at least some of the electromagnetic radiation. In one aspect, the heating may be practiced a temperature greater than 500 degrees C. or a temperature greater than 1000 degrees C. The charged particles may be ions, for example, hydrogen ions or helium ions. In one aspect, the substrate may be crystalline substrate, for example, oxide substrate, such as, a single-crystal sapphire substrate. In another aspect, the substrate may be a polygonal cylindrical or wafer substrate or a circular cylindrical or fiber substrate. Another embodiment of the invention is an electromagnetic radiation barrier fabricated by the above method.

Another embodiment of the invention is an electromagnetic radiation barrier comprising or including a region beneath a surface of a substrate, the substrate at least partially transparent to the electromagnetic radiation, and the region having a refractive index different from the refractive index of the bulk substrate at a temperature greater than 200 degrees C. In one aspect, the temperature greater than 500 degrees C. or greater than 1000 degrees C. In one aspect, the region having the refractive index different from the refractive index of the bulk substrate comprises a region having a refractive index less than the refractive index of the bulk substrate, for example, at least 3% less or at least 6% less than the refractive index of the bulk substrate. In another aspect, the region having the refractive index different from the refractive index of the bulk substrate comprises a region having a refractive index modified by charged particles, for example, ions. In one aspect, the region having the refractive index modified by charged particles comprises a region having voids introduced by the charged particles. In one aspect, the electromagnetic radiation barrier comprises a waveguide. In another aspect, the electromagnetic radiation barrier comprises a sensor.

Another embodiment of the invention is a method of fabricating an optical waveguide. The method comprises or includes directing a stream of hydrogen ions into a single-crystal sapphire substrate, the stream of hydrogen ions modifying a crystal structure of the sapphire beneath a surface of the substrate; and heating the single-crystal sapphire substrate to a temperature greater than 200 degrees C. wherein the hydrogen-ion-modified crystal structure of the sapphire is annealed and provides a barrier to passage of at least some optical light. Again, the heating temperature may be greater than 500 degrees C. or greater than 1000 degrees C.

A further embodiment of the invention is a method of fabricating a electromagnetic radiation waveguide. This method comprises or includes directing a stream of charged particles into a substrate, the substrate at least partially transparent to the electromagnetic radiation, the charged particles modifying a crystal structure beneath a surface of the substrate; and heating the substrate to a temperature greater than 200 degrees C. wherein the charged-particle-modified crystal structure is annealed and provides a barrier to passage of at least some of the electromagnetic radiation. In one aspect, modifying the crystal structure comprises introducing voids to the crystal structure.

Another embodiment of the invention is a method of fabricating an optical barrier. This method comprises or includes directing a stream of charged particles into a single-crystal sapphire substrate, the charged particles modifying a crystal structure beneath a surface of the single-crystal sapphire substrate; and heating the single-crystal sapphire substrate to a temperature greater than 200 degrees C. wherein the charged-particle-modified crystal structure is annealed and provides a barrier to passage of at least some optical radiation. In one aspect, directing the stream of charged particles into the single-crystal sapphire substrate comprises implanting a stream of charged particles into the single-crystal sapphire substrate. The charged particles may be ions, for example, hydrogen or helium ions.

In one aspect, the method further comprises rotating the single-crystal sapphire substrate, for example, rotating the single-crystal sapphire substrate while directing the stream of charged particles into the single-crystal sapphire substrate. In another aspect, the single-crystal sapphire substrate comprises a circular cylindrical substrate, and rotating the single-crystal sapphire substrate comprises rotating the circular cylindrical single-crystal sapphire substrate about an axis of the circular cylindrical single-crystal sapphire substrate. In one aspect, the heating may be practiced at a temperature greater than 1000 degrees C. or a temperature greater than 1500 degrees C. In on aspect, the optical barrier provided is adapted for use with one or more fiber-grating sensors. In another aspect, the optical barrier me be a single-mode or a multi-mode fiber.

In another aspect of the invention, directing the stream of charged particles into a single-crystal sapphire substrate comprises directing a first stream of charged particles having a first energy into the single-crystal sapphire substrate, wherein the method further comprises directing a second stream of charged particles having a second energy, different from the first energy, into the single-crystal sapphire substrate.

Another embodiment of the invention is a method of fabricating a sensor. This method comprises or includes directing a stream of charged particles into a substrate, the charged particles modifying a crystal structure beneath a surface of the substrate; and heating the substrate to a temperature greater than 200 degrees C. wherein the charged-particle-modified crystal structure is annealed and provides the sensor. The sensor may be a one or more fiber-grating sensor. The sensor may be a temperature sensor, a pressure sensor, or a chemical sensor, among others.

A still further embodiment of the invention is an optical barrier comprising a region beneath a surface of a substrate, the substrate at least partially transparent to light, and the region having a refractive index less than from the refractive index of the bulk substrate at a temperature greater than 200 degrees C., or greater than 500 degrees C., or greater than 1000 degrees C. The substrate of the barrier may be a single-crystal sapphire substrate. In one aspect, the region having the refractive index less than the refractive index of the bulk substrate may be a region having a refractive index from about 0.1% less to about 10% less than the refractive index of the bulk substrate, for example, at least 3% less than the refractive index of the bulk substrate or at least 6% less than the refractive index of the bulk substrate. In one aspect, the optical barrier comprises a waveguide. In another aspect, the optical barrier comprises a sensor.

An even further embodiment of the invention is a waveguide comprising or including a substrate having at least one region having a crystal structure modified by charged particle irradiation and thermal annealing to a temperature greater than a first temperature to provide a refractive index in the at least one region less than a refractive index of the bulk substrate; wherein the refractive index of the at least one region is substantially stable at a temperature less than the first temperature. In aspects of the invention, the first temperature may be from about 200 degrees C. to about 1750 degrees C., for example, the first temperature may be 500 degrees C., 600 degrees C., 800 degrees C., 1000 degrees C., 1200 degrees C., or 1500 degrees C.

A further embodiment of the invention is a method of sensing a property of an environment. This method comprises or includes directing a stream of charged particles into a substrate, the substrate at least partially transparent to the electromagnetic radiation, the charged particles modifying a crystal structure beneath a surface of the substrate; heating the substrate to a temperature greater than a first temperature wherein the charged-particle-modified crystal structure is annealed and provides a barrier to passage of at least some of the electromagnetic radiation; exposing the substrate to a environment having a second temperature less than the first temperature; and detecting a in a characteristic of the substrate to determine the property of the environment at the second temperature. In aspects of the invention, embodiment, first temperature may be 500 degrees C., 1000 degrees C., 1200 degrees C., 1500 degrees C., or greater.

An even further embodiment of the invention is a sensor comprising or including a electromagnetic radiation barrier comprising a substrate at least partially transparent to the electromagnetic radiation and having a region beneath a surface of the substrate having a refractive index different from the refractive index of the bulk substrate at a temperature greater than 200 degrees C., greater than 500 degrees C., or greater than 1000 degrees C. The sensor substrate may be an aluminum oxide substrate, such as, a sapphire substrate or a single-crystal sapphire substrate. In one aspect, the region of the substrate having the refractive index different from the refractive index of the bulk substrate may be a region having a refractive index less than the refractive index of the bulk substrate, for example, at least 3% less or at least 6% less than the refractive index of the bulk substrate. The sensor may be a temperature sensor, a pressure sensor, or a chemical sensor, among other types of sensors. The sensor may be a fiber-grating-based sensor. In another embodiment the sensor may be fabricated by any one of the methods described above. Another embodiment is a sensor system having one or more of the sensors described above.

Aspects of the present invention may be used as sensor or sensing element, that is, as an "intrinsic sensor," and/or as means of transmitting signals from a remote sensor, that is, as "extrinsic sensor." The remote sensor may be an intrinsic sensor or an electronic sensor.

These and other aspects, features, and advantages of this invention will become apparent from the following detailed description of the various aspects of the invention taken in conjunction with the accompanying drawings

BRIEF DESCRIPTION OF THE DRAWINGS

The subject matter, which is regarded as the invention, is particularly pointed out and distinctly claimed in the claims at the conclusion of this specification. The foregoing and other features and advantages of the invention will be readily understood from the following detailed description of aspects of the invention taken in conjunction with the accompanying drawings in which:

DETAILED DESCRIPTION OF THE INVENTION

The present invention, in its several embodiments and many aspects, is based upon the use of charged particle implantation, for example, hydrogen ion implantation, combined with high temperature annealing to induce structural modifications (for example, local volume/density, stoichiometry and chemical bonding) in produce barriers to electromagnetic radiation in substrates, for example, thermally, mechanically and chemically stable barriers to electromagnetic radiation.

Figure 1:
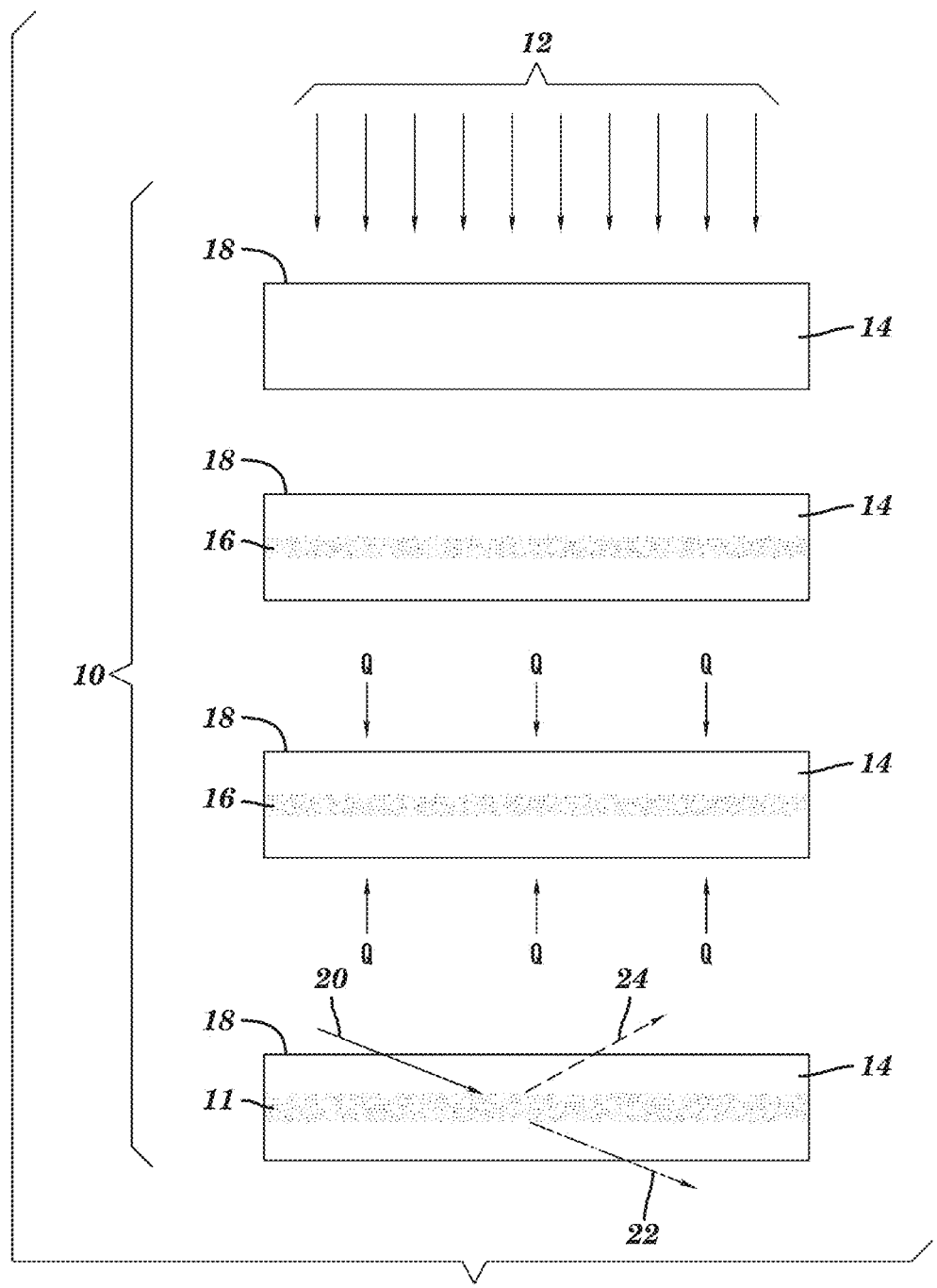
FIG. 1 is a schematic illustration of one aspect of the present invention for fabricating an electromagnetic radiation barrier or waveguide.

FIG. 1 provides a schematic illustration of one aspect of the present invention, in particular, a method 10 of fabricating an electromagnetic radiation barrier 11, for example, for confining electromagnetic radiation through a waveguide. As shown in FIG. 1, the method 10 includes or comprises first directing a stream of charged particles 12 into a substrate 14. The charged particles 12 may be electrons, protons, and/or ions, for example, in one aspect, charged particles 12 may be hydrogen ions, that is, substantially protons, and/or helium ions, that is, substantially alpha particles. The substrate 14 is at least partially transparent to the electromagnetic radiation, for example, optical light, for instance, optical laser light. Though aspects of the invention will be described herein as they apply to the obstruction or transmission of visible light, it is envisioned that aspects of the invention may be implemented for any form of electromagnetic radiation that can be transmitted through a substrate, including, but not limited to, microwaves, terahertz waves, infrared (IR) light, visible light, ultraviolet (UV) light, extreme ultraviolet (EUV) light, and X-rays, both hard and soft X-rays.

According to aspects of the invention, the charged particles 12 modify the crystal structure in a region 16 beneath the surface 18 of substrate 14, for example, to create a charged-particle-modified crystal structure in region 16. Substrate 14 may comprise any material, for example, any material whose structure can be modified by the interaction of the material's crystal matrix with the impingement of charged particles, for example, whereby the refractive index of the material can be varied. In one aspect, substrate 14 may comprise any crystalline material, including a monocrystalline material or a polycrystalline material, for example, substrate 14 may be a silicon-based substrate, or an oxide-based substrate, for example, an aluminum oxide ($Al_xO_y$)-based substrate, for instance, a ruby or sapphire substrate.

According to one aspect of the invention, substrate 14 may be a sapphire substrate, specifically, a "single-crystal" sapphire substrate. As known in the art, a "single crystal" material, also known as a "monocrystalline" material, is a material having a crystal lattice that is substantially continuous and unbroken, that is, having substantially no grain boundaries, and the crystal lattice typically has a well-defined orientation on the macroscopic scale as a whole. Single-crystal sapphire is chemically inert and has a relatively very high melting point (about 2050 degrees C.). Consequently, waveguides, including, optical waveguides, based on single-crystal sapphire can be uniquely suited for applications in high-temperature conditions, for example, for the delivery of high laser power and for optical sensing during combustion processes, among other processes.

As described above in the section "Background of the Invention," it is presently understood that the charged particles 12 can induce many structural changes to substrate 14, including changes in local atomic density, changes in chemical bonding, changes stoichiometry, stress, and even crystalline-to-amorphous phase transformation. According to aspects of the invention, these structural changes as a whole can modify the refractive index (n) in the implanted region 16 of substrate 14. Additionally, defect retention in the substrate 14 can increase optical loss of the propagating rations as it is scattered or absorbed by defect centers (for example, color centers). According to aspects of the invention, charged-particle implantation induced defects and their effects on optical properties of substrates, for example, sapphire crystals, can be stabilized. Moreover, defects can also be minimized or eliminated by some aspects of the invention.

The energy of the charged particles 12 may vary depending upon the nature and/or size of the charged particles 12 and/or the nature of the substrate 14. In one aspect, the charged particles 12 may be directed or implanted into substrate 14 with an energy ranging from about 10 kilo-electron-volts [keV] to about 20 million-electron-volts [MeV], but are typically directed or implanted into substrate 14 with an energy ranging from about 10 keV to about 10 MeV. As is known in the art, typically, the higher the ion implantation energy, the deeper the location of the barrier 11 below the surface 18 of the substrate 14.

In addition, the dose of ions may also vary depending upon the nature and/or size of the charged particle 12 and/or the nature of the substrate 14. In one aspect, the dose of particles 12 may range from about $10^{12}$ particles per square centimeter [$/cm^2$] to about $10^{17}/cm^2$, but the does typically ranges from about $10^{15}/cm^2$ to about $10^{17}/cm^2$. It is understood that depending upon the type of the charged particles, for example, the ions, used, the dose of the implantation must be limited to avoid damaging the substrate material. For example, when hydrogen [H] ions are used for implantation of single-crystal sapphire, the implantation dose typically does not exceed $10^{17}/cm^2$ to avoid exfoliation of the sapphire.

The location of the region 16 beneath surface 18 of substrate 14 affected by particles 12 may also vary depending upon the nature and/or size of the charged particles 12 and/or the nature of the substrate 14. In one aspect, region 16 may be positioned from about 0.1 micrometers [μm] to about 100 μm, but is typically positioned from about 0.5 μm to about 30 μm.

According to aspects of the invention, since the microstructure of ion implanted substrate 14 can be expected to evolve or vary during post-implantation annealing (for example, during exposure to a temperature of a harsh environment), a mechanism will typically be provided to stabilize the microstructure of the material of substrate 14, for example, in region 16, to minimize or prevent changes in microstructure (for example during high temperature sensing). One aspect of the invention is provided to effect this desired stabilization. Specifically, following charged particle implantation 12, a heat treatment or "annealing" of the charged-particle implanted substrate 14 is practiced. In one aspect, this annealing of substrate 14, more specifically, the annealing of region 16, is conducted at an "annealing temperature," $T_a$. In one aspect, this annealing temperature $T_a$ is greater than or equal to the temperature at which the treated substrate 14 will likely be exposed to during use or sensing, that is, the "sensing temperature," $T_s$. For example, in one aspect, if the temperature to be probed by the treated substrate 14 is no greater than 1600 degrees C. (that is, $T_s \leq 1600$ degrees C.), then the charged particle implanted substrate 14, for example, a H-ion-implanted-sapphire substrate, may be thermally annealed at a temperature $T_a$ greater than 1600 degrees C. (that is, $T_a \geq 1600$ degrees C.), for example, at about 1700 degrees C.

According to aspects of the present invention, the duration, or time at $T_a$, of the high temperature annealing may be long enough so that the microstructures of the substrate, and, therefore, the refractive index profile in the substrate, may remain substantially unchanged, that is, stabilized, during the actual sensing measurements at $T_s$. In one aspect, the high-temperature annealing step may also promote the removal of defects in the charged-particle implanted region 16 of substrate 14. For example, if the temperature $T_a$ is sufficiently high, depending, for example, upon the type of charged particle used for implantation and the substrate material, the size of any cavities and/or voids, if formed in the implanted region 16, may be stabilized, for example, stabilized to nanometer scale dimensions, that is, typically much less than the wavelength of radiation being transmitted by the barrier or waveguide produced.

For instance, for a waveguide 14 intended to transmit optical light (for example, at a wavelength of about 1550 nm typically used for fiber-optic sensing), by stabilizing any voids and/or cavities to a dimension less than 1550 nm, the voids and/or cavities are unlikely to interfere with the transmit of the 1550 nm light. As a result, in one aspect of the invention, optical losses caused by light scattering from cavities and/or voids, such as, nanometer scale cavities and/or voids, may be minimized or eliminated.

According to aspects of the present invention, after treating the substrate 14 with charged particles 12 to produce region 16 having a charged-particle-modified crystal structure, treated substrate 14 is heated as indicated schematically by the energy input Q shown in FIG. 1. In some aspects, this heating is referred to as "annealing." However, in contrast to prior art, substrate 14 is heated to at least 200 degrees C. (that is, $T_a \geq 200$ degrees C.), but is typically heated, to at least 500 degrees C., or 1000 degrees C., or even 1500 degrees, or more. In one aspect of the invention, the temperature to which the substrate 14 is heated may only be limited to the softening, melting, or sublimation temperature of the substrate 14. For example, for sapphire substrates, the temperature to which the sapphire substrate may be heated to may be limited to the softening temperature of sapphire, that is, about 1700 degrees C., and the annealing temperature may be limited to less than 1700 degrees C., for example, to a temperature of about 1650 degrees C.

During the step of heating, the substrate 14 may be held at a target temperature ($T_a$), for example, 1000 degrees C., for at least 1 minute, but is typically held at temperature for at least 30 minutes, for example, from about 30 to about 300 minutes (that is, about 5 hours). The target temperature may be attained by increasing the temperature of substrate 14 from a first temperature, for example, room temperature (that is, about 20 degrees C.), to the target temperature, for example, 1000 degrees C., at a rate ranging from about 0.5 degrees C. per second [C/s] to about 2000 C/s, but typically at a rate of between about 0.5 C/s to about 500 C/s. In addition, after annealing at the target temperature, the substrate 14 may be cooled at a cooling rate ranging from about 0.5 C/s to about 100 C/s, but typically from about 0.5 C/s to about 50 C/s. The heating and cooling may be practiced by any conventional means, for example, cooling may be practiced by forced or unforced air cooling or by forced or unforced water cooling, but may typically be practiced by unforced air cooling.

According to one aspect of the invention, the heating or annealing may be practiced in an ambient atmosphere, for example, with room or laboratory air and atmospheric pressure, or at a predetermined atmosphere, for example, in a gaseous atmosphere at sub- or super-atmospheric pressure. In one aspect, heating or annealing may be practiced in nitrogen [N] gas atmosphere, an oxygen [O] gas environment, or an inert gas atmosphere, such as, in the presence of argon [Ar]. In another aspect, annealing may be practiced in an environment having a chemically active gas species present in the environment which the waveguide will be used for sensing and/or transmission, for example, in a carbon dioxide ($CO_2$), methane ($CH_4$), ammonia ($NH_3$), or hydrogen sulfide ($H_2S$) bearing environment, among others.

Heating or annealing may also be practiced under vacuum, for example, at a vacuum ranging from about $10^{-10}$ inches of mercury [in. Hg] to about 25 in. Hg, or under super-atmospheric pressure conditions, for example, at a pressure ranging from about 1 atmosphere [atm] to about 10 atm, but is typically practiced at a pressure from about 1 atm to about 2 atm.

According to aspects of the present invention, this heating or annealing at a temperature greater than 200 degrees C. creates or provides a barrier 11 to passage of at least some electromagnetic radiation beneath the surface 18 of substrate 14 that obstructs at least some electromagnetic radiation and can withstand temperatures greater than 200 degrees C., or at least 500 degrees C., or even 1000 degrees C., or more, for example, temperatures that may be experienced in harsh environments. For example, as shown schematically in FIG. 1, when electromagnetic radiation, as indicated by arrow 20, is directed into substrate 14 and impinges barrier 11, though some of the incident radiation, as indicated by arrow 22, may pass through barrier 11, at least some of the incident radiation, as indicated by arrow 24, may be reflected from barrier 11.

As known in the art, in order to be an effective barrier to electromagnetic radiation, there must be some variation or modification in the refractive index (n) in region 16 provided by the charged particle 12 treatment from the refractive index of the bulk substrate material, for example, single-crystal sapphire crystal. In one aspect, the variation may comprise an increase or a decrease in refractive index relative to the substrate material. According to one aspect of the invention, the variation in the refractive index (n) may range from about 0.1 percent [%] to about 10%, and is typically between about 0.5% to about 6%. In one aspect, the variation in refractive index from the substrate material may typically be a decrease in refractive index. For example, in one aspect, where the substrate comprises single-crystal sapphire having a refractive index of 1.758, the refractive index in region 16 was decreased to about 1.65 (for light at a wavelength of 1550 nm) by applying aspects of the invention, that is, a reduction in refractive index of about 6%. It is generally understood that the variation in refractive index in substrate 14 provided by aspects of the invention may typically vary through region 16 in FIG. 1. For example, the above-specified values of refractive index variation may comprise average variations over or through the region 16, wherein in certain portions of region 16 the local index of refraction may be greater than or less than the specified variation, for instance, greater than or less than the 3% reduction or the 6% reduction in refractive index. The inventors have found that it is conceivable that the variation in refractive index may exceed 6% or more, or even 10% or more, in certain portions or at certain depths within region 16 of substrate 14.

In another embodiment of the invention, FIG. 1 illustrates an electromagnetic radiation barrier 11 including or comprising a substrate 14 having a subsurface region 16 providing an obstruction to at least some electromagnetic radiation 20. In one aspect, the region 16 has a refractive index (n) modified by charged particles 12 and then heated (Q) to a temperature greater than 200 degrees C. Substrate 14 may be heated or annealed to at least 500 degrees C., or even 1000 degrees C., or more to provide a barrier 11 capable to withstand harsh conditions, for example, temperatures over 1000 degrees C. that may be experienced in harsh environments. The barrier 11 shown in FIG. 10 may be a planar or a polygonal cylindrical barrier 11, for example, a "wafer-type" barrier, or a circular cylindrical, for example, a "fiber-type" barrier. For circular cylindrical applications of the invention, for example, for treating fibers, barrier 11 may comprise a "cladding" about a "core" of substrate material.

According to aspects of the invention, the step of directing a stream of charged particles 12 into a substrate 14 may be practiced 1 or more times, for example, multiple times. When practiced multiple times (or "a plurality" of times), the energy and dosage of the charged particles 12 may be about the same for each implantation, but may also vary. For example, a plurality of charged particle implantations 12 may be practiced at a plurality of charged particle energies and/or a plurality of charged particle doses. Accordingly, with varying energies and/or doses, in one aspect, a waveguide may be provided having one or a plurality of optical barriers 11, for example, at a plurality of depths or positions within substrate 14. In one aspect, an optimal barrier 11 may be provided having an optimal depth distribution of refractive index for the specific substrate material, for example, for single-crystal sapphire wafers or fibers.

Figure 2:
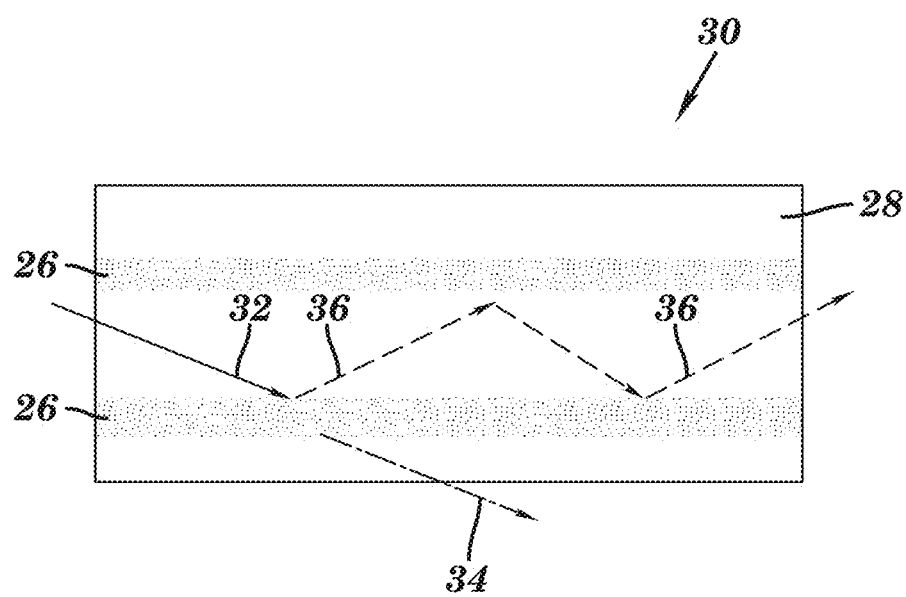
FIG. 2 is a schematic illustration of a substrate having a plurality of barriers according to another aspect of the invention.

It will be apparent to those of skill in the art that, though a single barrier 11 may be provided to substrate 14, it is envisioned that 2 or more barriers 11 can be produced in a single substrate 14 in a similar fashion to produce a waveguide, as shown in FIG. 2. As shown in FIG. 2, 2 or more barriers 26 are produced in a substrate 28 to provide a waveguide 30. Barriers 26 may be produced in a fashion similar to the method 10 illustrated and described with respect to FIG. 1, and substrate 28 may have all the attributes of substrate 14 illustrated and described with respect to FIG. 1. As shown in FIG. 2, barriers 26 can be used to obstruct the passage of electromagnetic radiation, as indicated schematically by arrow 32. Again, though some of the incident radiation, as indicated by arrow 34, may pass through barriers 26, at least some of the incident radiation, as indicated by arrow 36, will be reflected from barriers 26 and propagate along substrate 28 whereby waveguide 30 is provided. Though in the aspect of the invention shown in FIG. 2 schematically illustrates a planar or polygonal cylindrical waveguide 30, for example, a "wafer-type" waveguide, as will be discussed further below, aspects of the invention may also provide circular cylindrical or "fiber-type" waveguides.

In another embodiment of the invention, FIG. 2 illustrates an electromagnetic radiation waveguide 30 including or comprising a substrate 28 having a plurality of (that is, more than one) subsurface barrier 26 to at least some electromagnetic radiation 32. As shown, the barrier 26 comprises a region (16, in FIG. 1) having a refractive index (n) modified by charged particles (12, in FIG. 1) and then heated (Q, in FIG. 1) to a temperature greater than 200 degrees C. Substrate 28 may be heated or annealed to at least 500 degrees C., or even 1000 degrees C., or more to provide a waveguide capable to withstand harsh conditions, for example, temperatures over 1000 degrees C. that may be experienced in harsh environments. As shown in FIG. 2, waveguide 30 may have two or more barriers 26, for example, 3 or 4, or more barriers 26. The waveguide 30 shown in FIG. 2 may be a planar or polygonal cylindrical waveguide 30, for example, a "wafer-type" waveguide, or a circular cylindrical or "fiber-type" waveguide.

Figure 3:
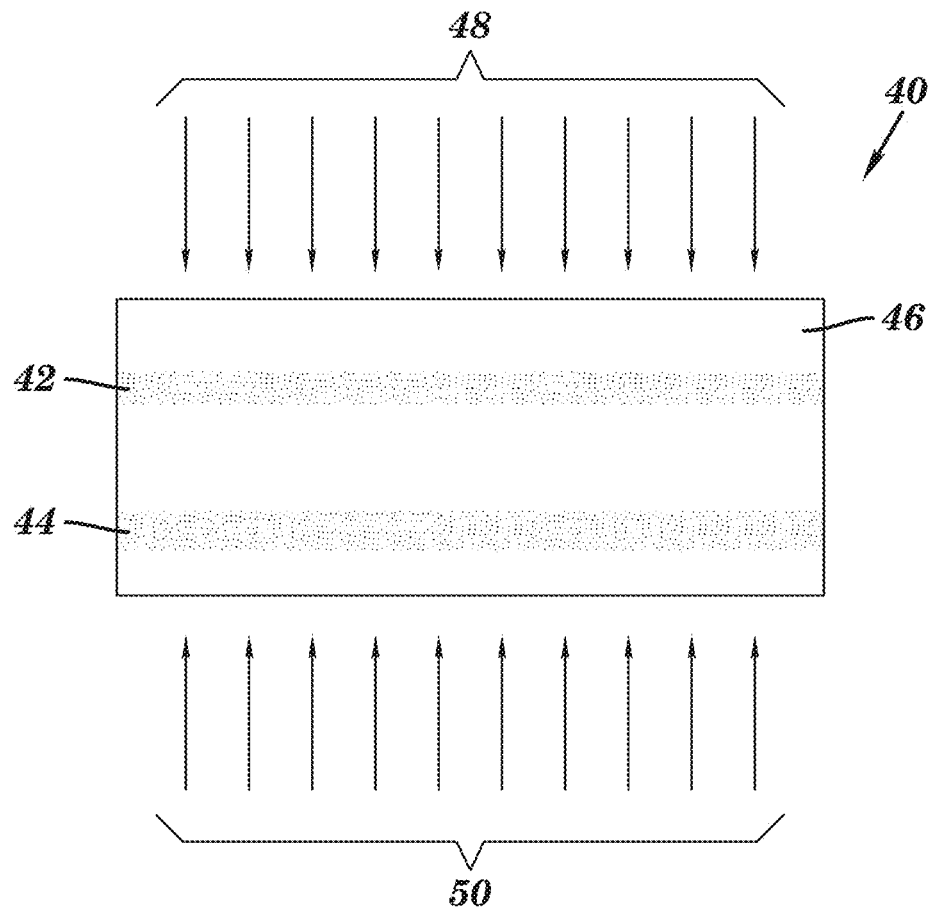
FIG. 3 is schematic illustration of one method for forming a plurality of barriers in a substrate according to one aspect of the invention.
Figure 4:
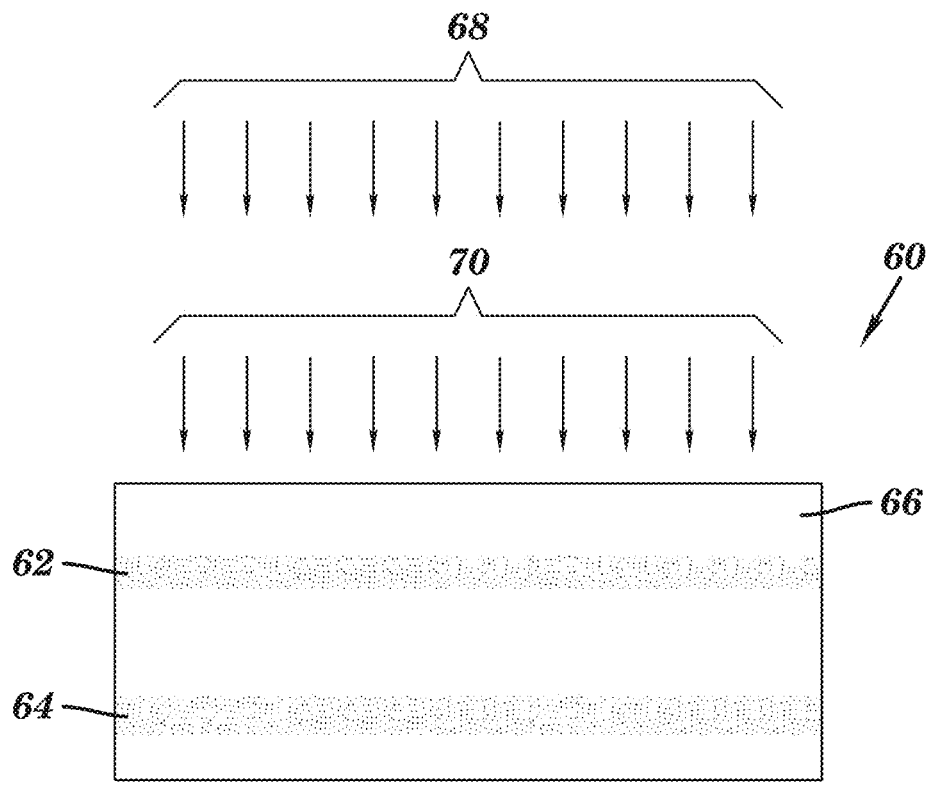
FIG. 4 is schematic illustration of another method for forming a plurality of barriers in a substrate according to another aspect of the invention.

FIGS. 3 and 4 illustrate two methods by which substrates having a plurality of barriers (or cladding) may be produced according to aspects of the invention. According to the method illustrated in FIG. 3, a waveguide 40 having a plurality of barriers 42, 44 is provided in a substrate 46 by exposing substrate 46 to 2 or more doses of charged particles 48 and 50, shown schematically in FIG. 12. In the aspect shown in FIG. 3, charged particles 48 and 50, for example, are directed upon different surfaces of substrate 66, for example, opposing surfaces, and provide two or more barriers 42 and 44 at different depths within substrate 66. Substrate 46 may be similar to and have the properties and characteristics of substrate 14 disclosed and described with respect to FIG. 1. For example, substrate 46 may be a single-crystal sapphire substrate and may be a planar or a polygonal cylindrical waveguide. Charged particles 48 and 50 may be similar to and have the properties and characteristics of charged particles 12 disclosed and described with respect to FIG. 1. For example, charged particles 48 and 50 may be doses of hydrogen ions.

In the aspect of the invention, shown in FIG. 3, barrier 42 is formed by charged particles 48 and barrier 44 is formed by charged particles 50 in a fashion similar to the method of formation of barrier 11 by charged particles 12 in FIG. 1. Particles 48 and 50 may comprise different dosages and the dosages may be applied for different durations. In one aspect, the dosage and duration of implantation of charged particles 48 and 50 may be the same or about the same. Accordingly, since the dosages and duration of charged particle 48 and 50 may vary, the nature and depth of barriers (or cladding) 42 and 44 may vary. As will be apparent to those of skill in the art, other permutations and combinations of different dosages, different energies, different durations of exposure, and/or different types of charged particles may be used for implantation of charged particles 48 and 50 to vary the nature and depth of barriers (or cladding) 42 and 44.

According to the method illustrated in FIG. 4, a waveguide 60 having a plurality of barriers 62, 64 is provided in a substrate 66 by exposing substrate 66 to 2 or more doses of charged particles 68 and 70. In the aspect shown in FIG. 4, different dosages and/or different energies and/or different durations of exposure and/or different types of charged particles may be used for implantation of charged particles 68 and 70, for example, on the same surface of substrate 66, to provide two or more barriers 62 and 64 at different depths within substrate 66. Substrate 66 may be similar to and have the properties and characteristics of substrate 14 disclosed and described with respect to FIG. 1. For example, substrate 66 may be a single-crystal sapphire substrate and may be a planar or a polygonal cylindrical waveguide. Charged particles 68 and 70 may be similar to and have the properties and characteristics of charged particles 12 disclosed and described with respect to FIG. 1. For example, charged particles 68 and 70 may be doses of helium ions (that is, alpha particles).

In the aspect of the invention, shown in FIG. 4, barrier 62 is formed by charged particles 68 and barrier 64 is formed by charged particles 70 in a fashion similar to the method of formation of barrier 11 by charged particles 12 in FIG. 1. Particles 68 and 70 may comprise different energies and the dosages may be applied for different durations. For example, in one aspect, the dosage and duration of implantation charged particles 68 and 70 may be the same or about the same, but the energy or the type of charge particle used may vary. As will be apparent to those of skill in the art, other permutations and combinations of different dosages, different energies, different durations of exposure, and/or different types of charged particles may be used for implantation of charged particles 68 and 70 to vary the nature and depth of barriers (or cladding) 62 and 64.

According to aspects of the invention, charged particles, for example, H ion beams, are used for tailoring the refractive index profile in waveguides, for example, waveguide fiber matrices, via structural modifications induced by the charged particle implantation. In one aspect, charged particles are implanted into substrate fibers through their sidewalls, thus forming a circular band (if viewed from the fiber end or cross section) of lower refractive index values below the substrate fiber surface. This band of lower refractive index can serve as an optical barrier, or a cladding layer, in substrate fibers allowing waveguiding in the fiber core which is below the ion implanted region, and provide a waveguide fiber that can be used in harsh condition sensing. According to aspects of the invention, cladding structures which are embedded in the fiber can be provided. These embedded fiber structures, since they are protected by the surface of the fiber, may not be exposed directly to the sensing ambient, such as, excessive temperature, pressure, and/or chemistry, and as a result, can be highly stable in harsh sensing environments, for example, having a potential for sensing applications at temperatures above 200 degrees C., above 500 degrees C., and even well above 1000 degrees C. This capability contrasts with existing art cladding methods and structures which are typically prepared with a material chemically and structurally different from the waveguide substrate material which are susceptible to damage, deterioration, and failure under harsh conditions.

Figure 5:
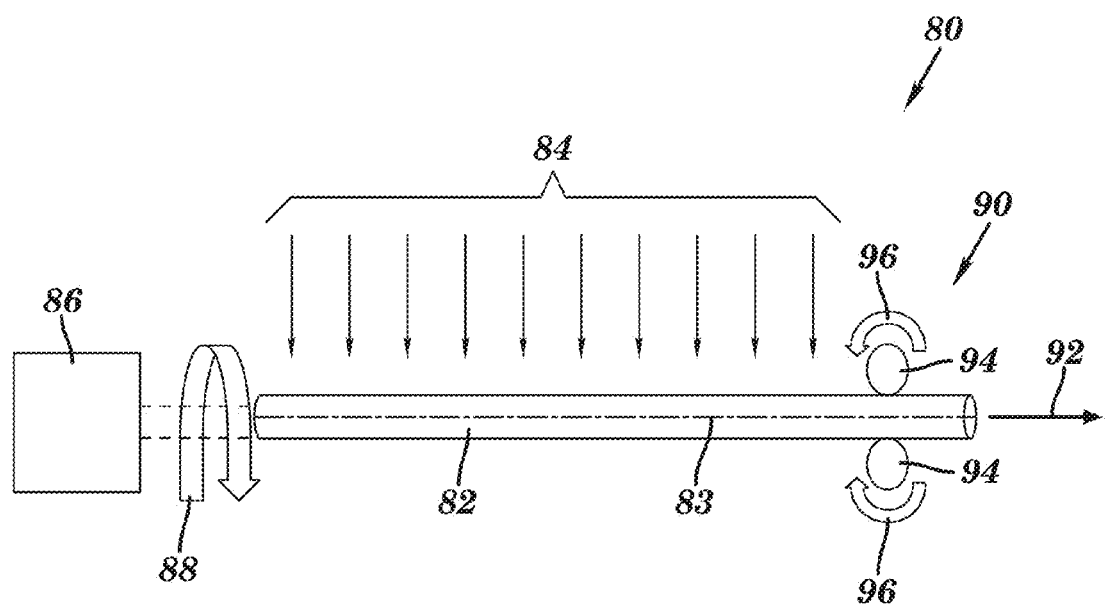
FIG. 5 is a schematic illustration of methods and apparatus for producing barriers or waveguides to electromagnetic radiation in circular cylindrical substrates according to another aspect of the invention.

FIG. 5 is a schematic illustration of methods and apparatus 80 for producing barriers or waveguides to electromagnetic radiation in circular cylindrical substrates, for example, in optical fibers. As shown in FIG. 5, apparatus 80 is adapted to treat a circular cylindrical substrate, or fiber, 82 with charged particles 84. For example, fiber 82 may typically be mounted so that the fiber axis 83 is perpendicular to the impinging ion beam 84. Again, substrate 82 may have all the attributes of substrate 14, for example, a single-crystal sapphire fiber, and charged particles 86 may have all the attributes of charged particles 12, for example, hydrogen ions, shown in FIG. 1. Fiber 82 is enlarged in FIG. 5 to facilitate illustration of this aspect of the invention. Typical fibers 82 that may be treated according to aspects of the invention may have an outside diameter ranging from about 0.001 inches to about 0.02 inches, and are typically about 0.004 inches in outside diameter.

According to the aspect of the invention shown in FIG. 5, apparatus 80 includes means 86 for rotating fiber 82, as indicated by curved arrow 88, and apparatus 80 may also include means 90 for translating fiber 82, as indicated by arrow 92. According to this aspect, one or more doses of charged particles 84, for example, from a stationary source of charged particles (not shown), are implanted into a rotating fiber 82 to produce a circular or cylindrical barrier or cladding about a core of fiber 82. According to the invention, after implantation, fiber 82 may be heated or annealed at temperature as disclosed herein.

Means 86 for rotating fiber 82 in apparatus 80 may be any conventional means for rotating a fiber or similar structure. For example, means 86 may be adapted so that fiber 82 may be substantially constantly rotated about its axis 83 to allow for uniform charged particle implantation into the fiber cylindrical surface along substantially all directions, for example, all radial directions, during implantation. As shown in FIG. 5, means 86 is operatively connected (shown in phantom) to fiber 82 whereby fiber 82 is rotated about its centerline or axis of elongation 83. Means 86 for rotating fiber 82 may comprise a motor or stepper motor with an appropriate drive train or speed reducer to provide a desired speed of rotation of fiber 82. The drive train may include an appropriate speed controller adapted to regulate the speed of rotation of fiber 82, for example, depending upon the size (for example, diameter) of fiber 82, the material of fiber 82, and the dose and type of charged particles 84, among other things, used for apparatus 80.

Though fiber 82 may not be translated, for fibers having a length longer than a specified length, for example, for fibers 82 having length greater than 8 inches (that is, the maximum dimension for ion beam scanning available from some accelerator facilities), aspects of the invention may include means 90 for translating fiber 82. Means 90 may be adapted to translate fiber 90 whereby fiber 82 can be implanted substantially continuously, for example, while rotating, from one portion of fiber 82 to an adjacent portion of fiber 82 along its axial direction, for instance, without the need to break the vacuum or other environment and reposition fiber 82.

Means 90 for translating fiber 82 in apparatus 80 may be any conventional means for translating a fiber or similar structure. As shown in FIG. 5, means 90 may include one or more rollers 94 operatively connected to fiber 82 and adapted to rotate as indicated by curved arrows 96 whereby fiber 82 is translated, for example, translated in a direction along its centerline or axis of elongation 83. Means 90 for rotating fiber 82 may comprise a motor or stepper motor with an appropriate drive train or speed reducer to provide a desired speed of rotation of rollers 94 and speed of translation of fiber 82. The drive train may include an appropriate speed controller adapted to regulate the speed of translation of fiber 82, for example, depending upon the size (for example, diameter) of fiber 82, the material of fiber 82, and the dose and type of charged particles 84, among other things, used for apparatus 80.

According to aspects of the invention the method and apparatus 80 shown in FIG. 5 may be used for forming barriers or cladding structures embedded in in substrates and/or fibers, for example, single-crystal sapphire fibers. Charged particles 84, such as, hydrogen ions, can be implanted, for example, implanted substantially uniformly, into fibers 82 through the fiber sidewalls and provide for the formation of one or more circular or annular barriers or cladding layers (with a varied, typically lower, refractive index compared to the surrounding fiber material) at depths within the fiber 82 determined by, among other things, the charged particles 84, the charged particle energy, and the material of fiber 82. Subsequent heating or annealing, for example, at temperatures greater than 1000 degrees C., can be performed to "freeze" the profile of refractive index in fiber 82. Accordingly, the fiber core, for example, core 102 in FIG. 15, is thus defined by the intact, un-implanted portion of fiber 82 with the core size tailored by the location of the barriers or the implanted charged particle energies, among other things.

For example, in one aspect, when 2.0 MeV hydrogen [H] ions are implanted in a single-crystal sapphire fiber having a 100 μm outer diameter, the cladding layer (for example, cladding 100 in FIG. 15) can be located at about 25 μm (which is comparable to the projected depth range of 2.0 MeV H ions in sapphire) below the surface of fiber 82, and the fiber core diameter can be about 50 μm. It is believed that the diameter of the core may further be reduced when a higher H ion energy is utilized. In one aspect of the invention, it is envisioned that applying aspects of the invention can produce single-mode fibers, for example, single-mode sapphire fibers. In addition, it is also envisioned that by providing appropriate selection of charged particles, charged particle energies, charge particle dosage, among other things, multiple cladding/barrier structures at different depths in fibers can be fabricated using aspects of the invention.

Figure 6:
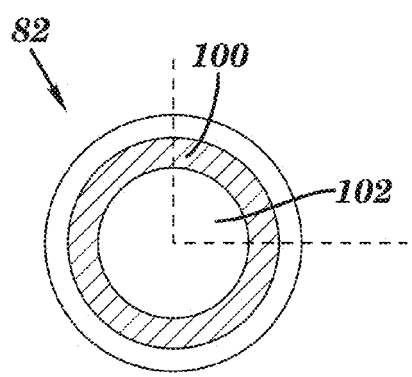
FIG. 6 is an enlarged schematic cross sectional view of a fiber after treatment with apparatus shown in FIG. 5 according to one aspect of the invention.
Figure 7:
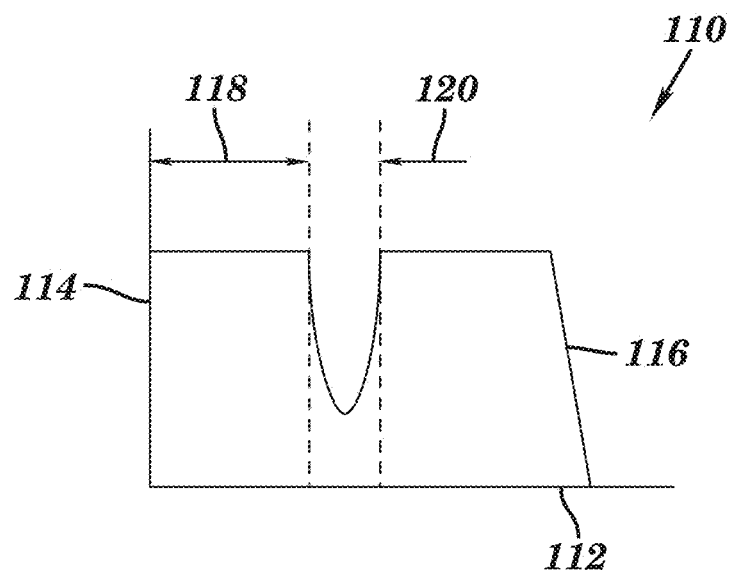
FIG. 7 is a graph of the variation in refractive index (n) for a fiber as a function of the radius that can be achieved with aspects of the invention.

One example of the cladding that may be formed by apparatus 80 is shown in FIG. 6. FIG. 6 is an enlarged schematic cross sectional view of a fiber 82 after treatment with apparatus 80 according to one aspect of the invention. As shown in FIG. 6, in one aspect, by treating a rotating fiber 82 with apparatus 80, the single-clad fiber 82 may be produced. Single-clad fiber 82 includes an annular barrier or cladding 100 about a core 102. FIG. 7 is a graph 110 of the variation in refractive index (n) for fiber 82 as a function of the radius, or distance from the center, of fiber 82 that can be achieved with aspects of the invention. The graph 110 in FIG. 7 includes an abscissa 112 corresponding to the radial distance from the center of fiber 82, an ordinate 114 corresponding to the refractive index, and a curve 116 representing the variation in refractive index with radius that can be provided according to aspects of the invention. As shown in FIG. 7, the refractive index through the core 102 in FIG. 6 may be relatively constant and unchanged from the refractive index of the fiber material, as indicated by section 118 of curve 116. However, the refractive index in the barrier or cladding 100 in FIG. 6 varies, in this case decreases, with respect to the core 102 and base index of the material, as indicated by section 120 of curve 116, providing the barrier that characterizes aspects of the present invention.

Figure 8:
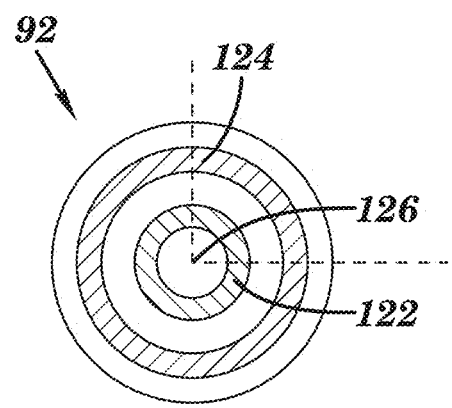
FIG. 8 is an enlarged schematic cross sectional view of a fiber with multiple claddings after treatment with apparatus shown in FIG. 5 according to another aspect of the invention.
Figure 9:
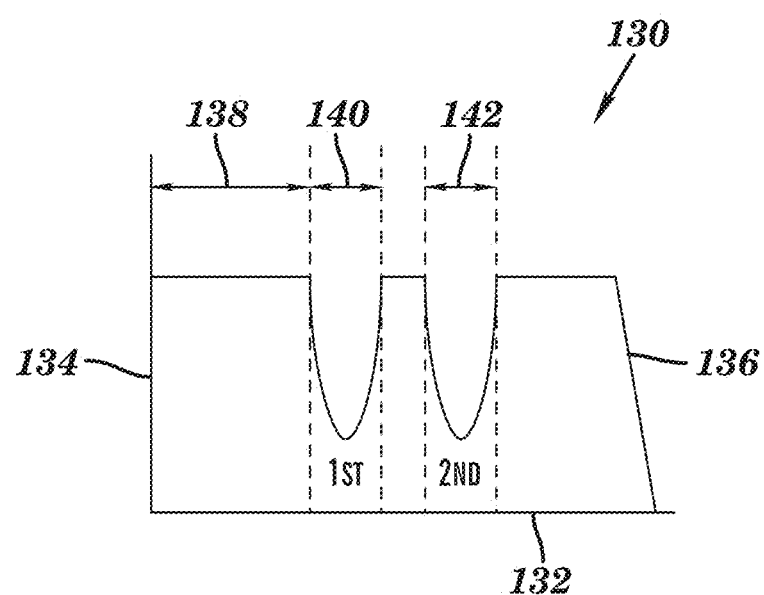
FIG. 9 is a graph of the variation in refractive index (n) for fiber with multiple claddings as a function of the radius that can be achieved with aspects of the invention.

Apparatus 80 shown in FIG. 5 may also provide multiple barriers or claddings to fiber 82, for example, by treating fiber 82 with multiple doses of charged particles 84. Another example of the cladding that may be formed by apparatus 80 is shown in FIG. 8. FIG. 8 is an enlarged schematic cross sectional view of a fiber 82 after treatment with apparatus 80 according to another aspect of the invention, in this case to form multiple barriers or claddings. As shown in FIG. 8, in one aspect, by treating a rotating fiber 82 with apparatus 80, the multi-clad fiber 92 may be produced. Multi-clad fiber 92 includes annular barriers or claddings 122 and 124 about a core 126. FIG. 9 is a graph 130 of the variation in refractive index (n) for fiber 92 as a function of the radius of fiber 92 that can be achieved with aspects of the invention. The graph 130 in FIG. 9 includes an abscissa 132 corresponding to the radial distance from the center of fiber 92, an ordinate 134 corresponding to the refractive index, and a curve 136 representing the variation in refractive index with radius that can be provided according to aspects of the invention. As shown in FIG. 9, the refractive index through the core 126 in FIG. 8 may be relatively constant and unchanged from the refractive index of the fiber material, as indicated by section 138 of curve 136 in FIG. 9. However, the refractive index in the first or inner barrier or cladding 122 in FIG. 17 varies, in this case decreases, with respect to the core 126 and base index of the material, as indicated by section 140 of curve 136, and the refractive index in the second or outer barrier or cladding 124 in FIG. 8, varies, in this case decreases, with respect to the core 126 and base index of the material, as indicated by section 142 of curve 136. Though only two barriers or claddings 122 and 124 are shown in FIGS. 8 and 19, it is envisioned that 2 or more barriers or claddings may be provided according to aspects of the invention, for example, 3 or more, or 4 or more, in a fiber.

According to aspects of the invention, the method and apparatus 80 of FIG. 5 may provide single-mode and multi-mode fibers, for example. In one aspect, for the fabrication of single-mode fibers, for example, single-mode sapphire fibers, the location of the created barrier 100 (in FIG. 6), 122, and 124 (in FIG. 8) may need to be relatively deep within the fiber 82, 92, (for example, tens of μm below surface) to minimize the size of resultant fiber core region 102, 126 of the fiber 82, 92. However, in one aspect, the thickness of the barrier(s) 100, 122, 124 may be sufficiently large enough to minimize or prevent the radiation, for example, light, leaking from the fiber core 102, 126. In one aspect, this may require several charged particle implantations, for example, of various implantation energies and/or doses as well as multiple post-implantation annealing steps, possibly at different annealing temperatures, to provide the desired barriers or cladding with little or no leakage.

Testing of Aspects of the Invention

Experiments have been performed to investigate the effects of charged particle implantation on the optical properties of substrates and the waveguiding performance of optical fibers with respect to aspects of the invention. In these experiments, hydrogen [H] ion implantation of sapphire crystal was investigated for its potential to create the desired optical barrier where the refractive index is lower than that of the virgin sapphire crystal. The choice for H ions lies in the minimal defect production rate, compared to other heavier ion species, and this feature of H ions helps minimize optical losses of buried waveguides in sapphire fibers.

Figure 10:
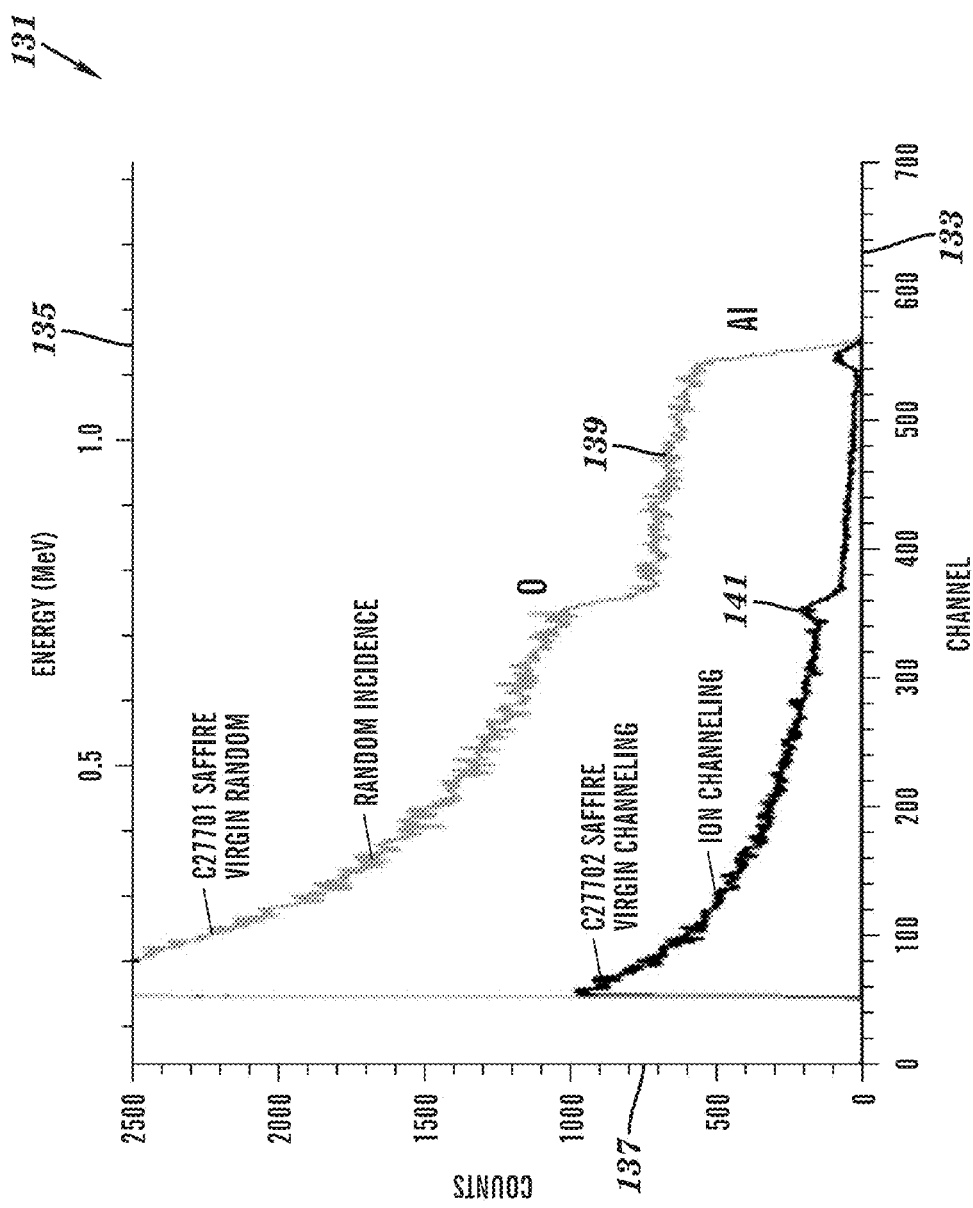
FIG. 10 is a graph of the Rutherford backscattering (RBS) spectra of H-implanted single-crystal sapphire according to another aspect of the invention.

FIG. 10 shows a graph 131 of the Rutherford backscattering (RBS) spectra of H-implanted single-crystal sapphire for random incidence and c-axis channeling conditions. The graph 131 in FIG. 19 includes a first abscissa 133 corresponding to the channel number of the ion energy analyzer; a second abscissa 135 corresponding to the energy of the incident H ions, in MeV; an ordinate 137 corresponding to the ion counts detected at each channel; a first curve 139 representing the backscatter of the sapphire crystal for randomly incident H ions; and a second curve 141 representing the backscatter of the sapphire crystal for c-axis channeling conditions. As indicated by curves 139 and 141, the RBS/channeling spectrum for the H-implanted sapphire shows a very low RBS yield, almost the same as that for the virgin sapphire sample, indicating that the H ion implantation indeed did not produce much damage to the sapphire crystal. Accordingly, H ion implantation was suitable for these experiments and could be one form of charged particle that can be used in practicing aspects of the invention.

In another experiment, a single-crystal sapphire wafer (c-axis orientation) was implanted with 200 keV hydrogen [H] ions to a dose of $5 \times 10^{16}/cm^2$ and subsequently annealed at 1000 degrees C. for an hour in a nitrogen [$N_2$] atmosphere. The resulting wafer was examined by ellipsometry measurements to extract the values of refractive index and absorption coefficient in the sapphire sample. The ellipsometry data were modeled using a three-layer model. The resulting variation of reflective index (n) and hydrogen concentration as a function of depth from the surface of the sapphire crystal are shown in FIG. 11.

Figure 11:
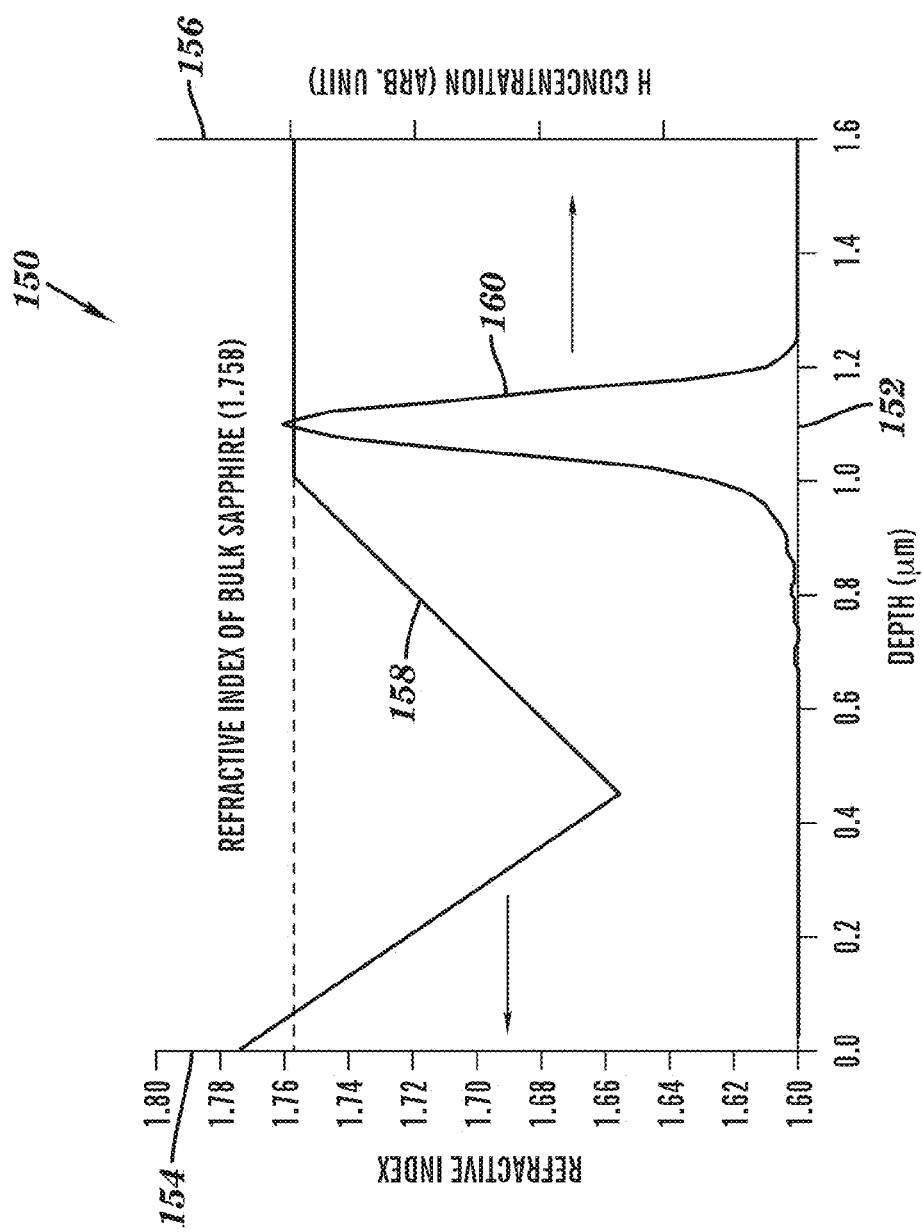
FIG. 11 is a graphical representation of the variation of reflective index (n) and hydrogen concentration as a function of depth from the surface of a sapphire crystal according to one aspect of the invention.

The graph 150 in FIG. 11 represents depth distribution of refractive index in single-crystal sapphire substrate obtained by modeling optical data. In the model used for this date, the implanted region was divided into two layers starting from the surface, and the thickness and refractive index of each layer were varied to fit the experimental data. FIG. 11 includes an abscissa 152 corresponding to the depth below the surface of the sapphire crystal, in μm; a first ordinate 154 corresponding to the refractive index; a second ordinate 156 corresponding to the hydrogen concentration (in arbitrary units); a curve 158 representing the variation in refractive index with depth; and a curve 160 representing the variation in hydrogen concentration with depth. As indicated by curve 158 FIG. 11, the refractive index of bulk the sapphire was about 1.758. By applying aspects of the invention, based upon these experiments, the refractive index in the sapphire was reduced to about 1.65 (for a wavelength of 1550 nm) at a depth of about 0.4 μm. This corresponds to a reduction of about 6% in refractive index by applying aspects of the invention. As indicated by curve 160 in FIG. 11, the total thickness of the first two layers was about 1.1 μm, which compares with the projected depth range for 200 keV protons in sapphire. In these experiments, within each layer the optical constants (refractive index and absorption coefficient) were assumed to vary linearly with depth. Accordingly, these experimental results indicate the creation of an optical barrier having a lower refractive index value in the sapphire sample.

A casual review of the data shown in FIG. 11 reveals a discrepancy between the depth of the barrier extracted by modeling the ellipsometry data and the depth of implanted hydrogen ions predicted by Monte Carlo simulation in FIG.

11. Specifically, in these experiments the ellipsometry measurements imply that the lowest refractive index (of about 1.65) occurs at around a depth of about 0.4 µm, whereas the concentration of implanted hydrogen implies a depth of about 1.1 µm. The inventors are presently unclear what the source of this discrepancy is, and speculate that the fast diffusion of hydrogen at high annealing temperature (that is, about 1000° C.) may be responsible for the appearance of minimum refractive index at a shallower depth in sapphire than predicted by Monte Carlo simulation.

Further experiments reveal that hydrogen ion implantation can lead to improved waveguiding performance in a single-crystal sapphire fiber. Following H ion implantation from the side of a six-inch long single-crystal sapphire fiber (without cladding), the waveguiding properties of the treated fiber were examined through optical reflectance measurement. A laser beam (~1550 nm wavelength) was coupled into the treated sapphire fiber from one end and the optical spectrum for the light reflected from the other end was measured. The results of this testing are summarized in FIG. 12.

Figure 12:
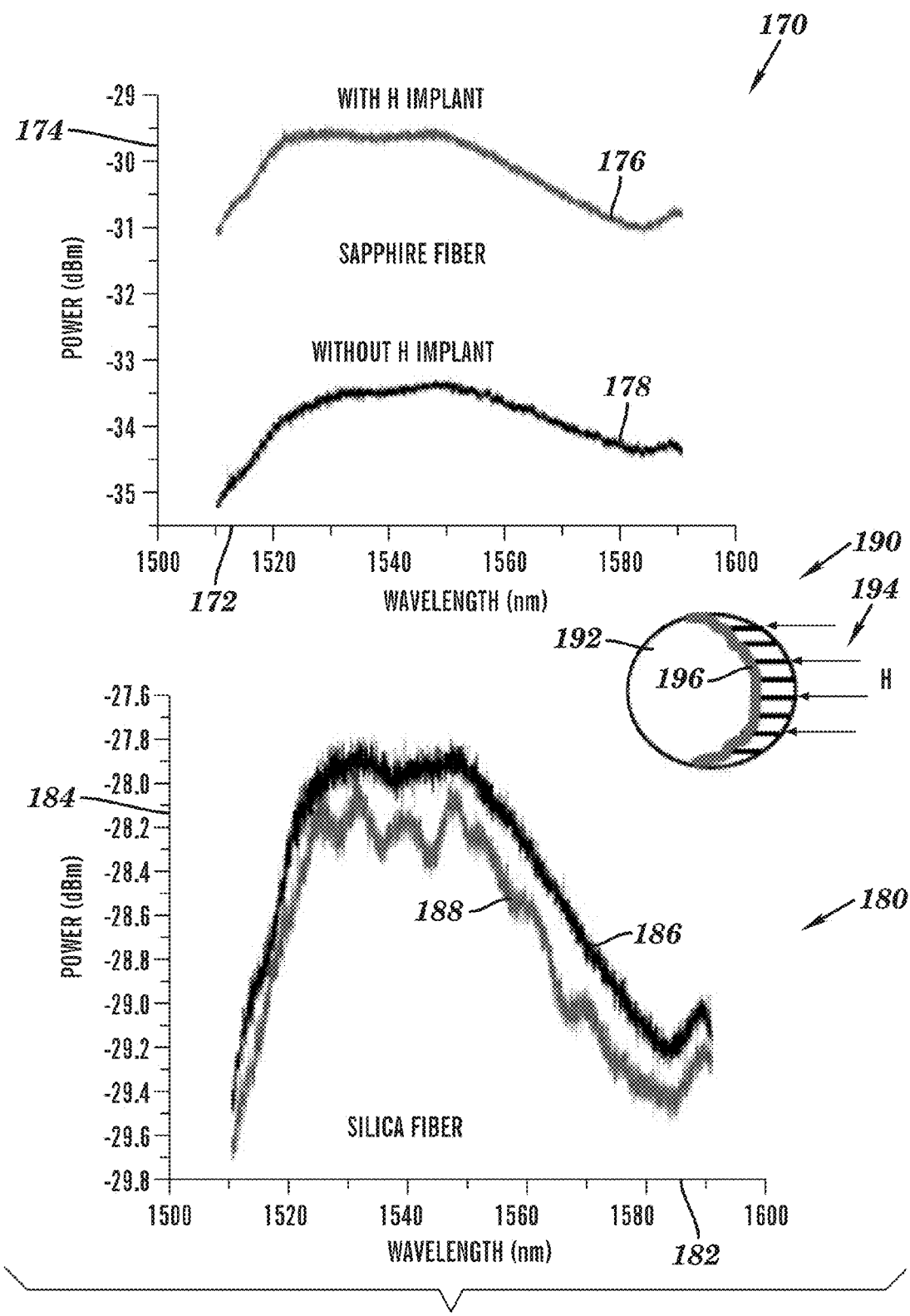
FIG. 12 shows two graphs and a schematic related to data provided of an investigation concerning aspects of the invention.

FIG. 12 shows two graphs 170 and 180, and a schematic 190 related to aspects of this investigation concerning the present invention. The schematic 190 schematically illustrates the treatment practiced in this experiment, that is, the implantation of fiber 192 (shown in cross section) with hydrogen ions 194 and then the annealing of fiber 192 to create a subsurface barrier 196 in fiber 192. The graph 170 in FIG. 12 represents the results of testing on a single-crystal sapphire fiber and includes an abscissa 172 corresponding to the wavelength of the implanting radiation, in nanometers [nm]; an ordinate 174 corresponding to the power emitted from the treated fiber when illuminated at the opposite end of the fiber, in decibels with reference to 1 milliwatt [dBm]; a first curve 176 representing the power variation as a function of wavelength for the sapphire fiber when treated according to aspects of the invention; and a second curve 178 representing the power variation as a function of wavelength for the sapphire fiber without being treated according to aspects of the invention. As shown in FIG. 12, graph 170, compared to a sapphire fiber not treated with ion beam implantation (curve 178), the reflected light intensity increased markedly for the H ion implanted sapphire fiber (curve 176). This suggests that H ion implantation modified the profile of refractive index in single-crystal sapphire, resulting in a decrease in optical loss (that is, less amount of light leaking from the fiber to the ambient) due to the formation of an optical barrier 196, though only a portion of fiber 192 was clad.

The graph 180 in FIG. 12 shows contrasting data for treatment of a silica fiber. Graph 180 represents the results of testing on a silica fiber and includes an abscissa 182 corresponding to the wavelength of the radiation, in nm; an ordinate 184 corresponding to the power emitted from the treated fiber when illuminated at the opposite end of the fiber, in dBm; a first curve 188 representing the power variation as a function of wavelength for the silica fiber when treated according to aspects of the invention; and a second curve 186 representing the power variation as a function of wavelength for the silica fiber without being treated according to aspects of the invention. As shown in FIG. 12, graph 180, in contrast to the data for the sapphire fiber shown in graph 170, a silica fiber (with its protective polymer layer removed) receiving the same H ion implant as the sapphire fiber exhibits a slight decrease in the reflected light intensity within the fiber (curve 188) compared to a silica fiber not treated with ion beam implantation (curve 186). This may reflect a marked difference in the effects of charged particle, for example, H ion, between implantation on single-crystal sapphire and amorphous silica fibers.

In these experiments, charged particle beams induced material modifications in the fiber through one fiber sidewall only. It is envisioned that if charged particles, such as, H ions, can be uniformly implanted in circular cylindrical substrates, for example, in single-crystal sapphire fibers, along all radial directions, then a circular barrier, or a desired fiber cladding structure, can be fabricated to confine the electromagnetic radiation, such as, light, within the fibers, as disclosed and discussed with respect to FIGS. 5 through 9. Moreover, it is envisioned that many processing parameters (for example, implantation energy and dose, fiber rotation control, and post-implantation annealing conditions, among others) can be optimized whereby charged particle implantation and annealing can provide an effective means for fabricating fiber claddings, for example, sapphire fiber claddings. Among other applications, aspects of the present invention may be uniquely applicable to providing fiber-type wave-guides capable of withstanding harsh environment conditions.

Figure 13:
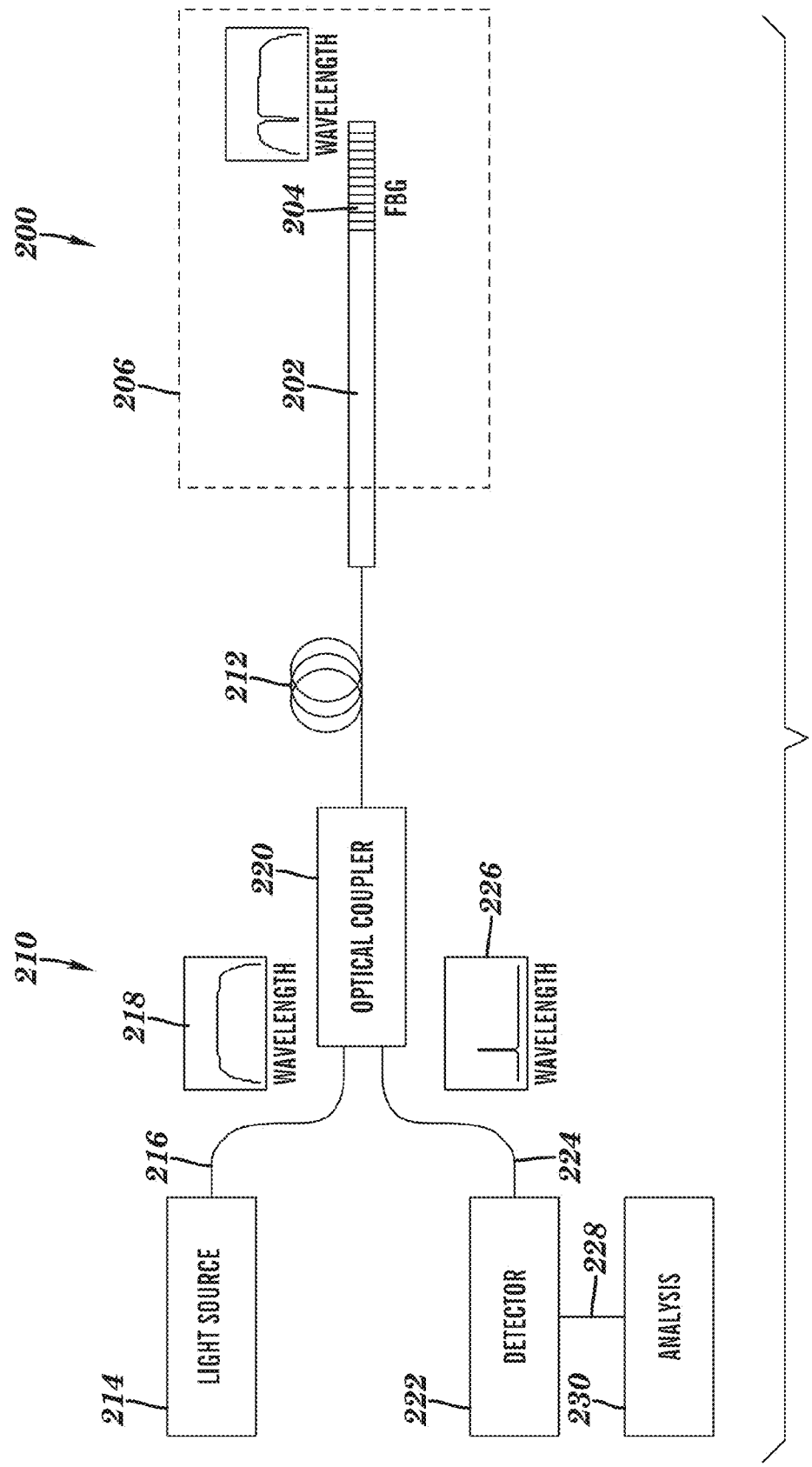
FIG. 13 is schematic diagram of a typical optical fiber sensing system according to one aspect of the invention.

FIG. 13 is a schematic illustration of still another embodiment of the present invention. FIG. 13 is a schematic diagram of a typical optical fiber sensing system 200 according to one aspect of the invention. In this aspect, system 200 includes one or more optical fibers 202 fabricated according to aspects of the invention, for example, a sapphire fiber, optically coupled to one or more sensors 204, for example, a diffraction grating, for instance, an FBG grating as described previously. The one or more fibers 202 may be single mode or multi-mode fibers. The one or more sensors 204 may be fabricated by aspects of the present invention, for example, ion implantation and annealing, though any conventional sensor, for example, a sensor that can withstand harsh conditions, may be used.

According to aspects of the invention, the optical fiber 202 and sensor 204 may be positioned within an environment 206 having harsh conditions, for example, an environment having a high temperature, for example, a temperature greater than 1000 degrees C., such as, an industrial combustion environment as described previously. Sensor 204 may be adapted to detect one or more environmental conditions in environment 206, for example, temperature, pressure, and/or strain, while exposed to the harsh conditions. According to aspects of the invention, optical fiber 202 and sensor 204 allow measurement of conditions within environment 206 while the rest of the sensing system 200 may be isolated or otherwise protected from environment 206. This isolation may be provided by distance and/or by barriers (not shown), such as, the walls and/or housings of the equipment or vessel containing environment 206.

As shown in FIG. 13, system 200 typically includes instrumentation 210 coupled, for example, optically coupled, to optical fiber 202 and sensor 204. In one aspect, instrumentation 210 may be optically coupled to one or more fibers 202 and one or more sensors 204 by one or more optical fibers 212. Optical fiber 212 may be an optical fiber fabricated according to aspects of the present invention, but, typically, since fiber 212 may not be exposed to harsh conditions, fiber 212 may be a conventional single mode or multimode optical fiber.

According to aspects of the invention, instrumentation 210 may typically include an electromagnetic radiation source 214, for example, a light source, such as, a broadband light source, adapted to generate and direct a beam of radiation, such as, light, into a waveguide or optical fiber 216, and which ultimately may be reflected from sensor 204. In one aspect, source 214 may be a DL-B1-1501A SLED light source provided by DenseLight Semiconductors, or its equivalent. In order to facilitate this discussion, the radiation generated by source 214 will be referred to as "light," but it is to be understood that, according to aspects to the invention, any form of electromagnetic radiation, as discussed previously, may be emitted by source 214 and used with aspects of the present invention.

As indicated in FIG. 13, the beam of light introduced to optical fiber 216 may typically have a wavelength, as indicated by wavelength 218 in FIG. 13, for example, a wavelength ranging from about 1500 nm to about 1700 nm. As is typical in the art, and according to aspects of the invention, the light in optical fiber 216 is coupled to fiber 212 by means of an optical coupler 220. For example, in one aspect, optical coupler 220 may be a 6015-3-Fiber Optic Circulator optical coupler provided by Thor Labs, or its equivalent.

Instrumentation 210 also typically includes a detector 222 adapted to receive light reflected from sensor 204 via waveguide or optical fiber 224 and optical coupler 220. As shown in FIG. 13, optical fiber 224 may also be optically coupled to fiber 212 by optical coupler 220. Detector 222 may include several components and embedded electronics adapted to process the optical signal received via fiber 224 and may provide output, such as, the graphical display of wavelength 226 shown in FIG. 13, illustrating wavelength peaks reflected from sensor 204 and transmitted by fiber 224. In one aspect, detector 222 may be a I-MON 512E detector provided by Ibsen Photonics, or its equivalent. As indicated in FIG. 13, the beam of light introduced to detector 222 by optical fiber 224 may typically have a wavelength, as indicated by wavelength 226 in FIG. 13, for example, a wavelength characteristic of the one or more parameters, such as temperature or strain, detected by sensor 204. For instance, in one aspect, the wavelength 226 may typically fall within the range of the wavelength of source 214, for example, within a range of about 1500 nm to about 1700 nm. For example, in one aspect, where the sensor 204 is a FBG sensor and the source 214 provides a light beam having a wavelength from about 1500 nm to about 1700 nm, the light reflected from sensor 204 and transmitted through fiber 224 may have a wavelength of about 1 nm in width within the range of 1500 nm to 1700 nm. According to aspects of the invention, the wavelength 226 may typically vary as the parameter, for example, temperature, in environment 206 varies.

The optical coupler 220 may be adapted to direct light in the appropriate directions. For example, optical coupler 220 may be adapted to direct light from the light source 214 and fiber 216 to fiber 212, fiber 202, and sensor 204, and to direct light reflected from sensor 204 to fiber 224 and detector 222.

As shown in FIG. 13, detector 222 may be electrically coupled to an analyzer 230 via one or more electrical connections 228. Analyzer 230 may be any conventional analyzer adapted to receive one or more signals from detector 222, for example, signals corresponding to the wavelength 226 of light received by detector 222, and extract the appropriate parameter of environment 204 detected by sensor 204. In one aspect, analyzer 230 may be a computer or other processor adapted to interface with detector 222 and, for example, is adapted to record and/or monitor signals and data generated by detector 222. Analyzer 230 may typically include a conventional user interface (not shown), such as, a keyboard, and an output device (not shown), such as, a video display and/or printer.

In the aspect of the invention shown in FIG. 13, sensor 204, for example, an FBG sensor, may function as a "mirror" for certain wavelengths of light, and system 200 may monitor the reflected wavelengths of light when sensing parameters or variation in parameters in environment 206. This mode of operation of system 200 may be referred to as "reflection mode." In another aspect of the invention, system 200 may be adapted to function in "transmission mode." For example, in transmission mode, system 200 may be adapted to monitor the light transmitted through sensor 204, for example, to monitor the absence or lack of wavelength of the light transmitted through sensor 204 and thereby detect a parameter or a change in parameter within environment 206. In the transmission mode of operation, light source 214 may be coupled, for example, directly coupled, to fiber 212, and through fiber 212 light source 214 may coupled to fiber 202 and to a first end of sensor 204. Accordingly, in transmission mode, detector 222 may be coupled to a second end of sensor 204, opposite the first end, and detector 222 may be adapted to receive light transmitted through sensor 204 and detect variations in wavelength (similar to wavelength 226 in FIG. 13) to detect a parameter or a change in parameter within environment 206. Also, though shown as individual components in the aspect of the invention shown in FIG. 13, in one aspect, detector 22, light source 214, and optical coupler 220 may be integrated into a single device, such as, an sm125 Optical Sensing Interrogator provided by Micron Optics.

Figure 14:
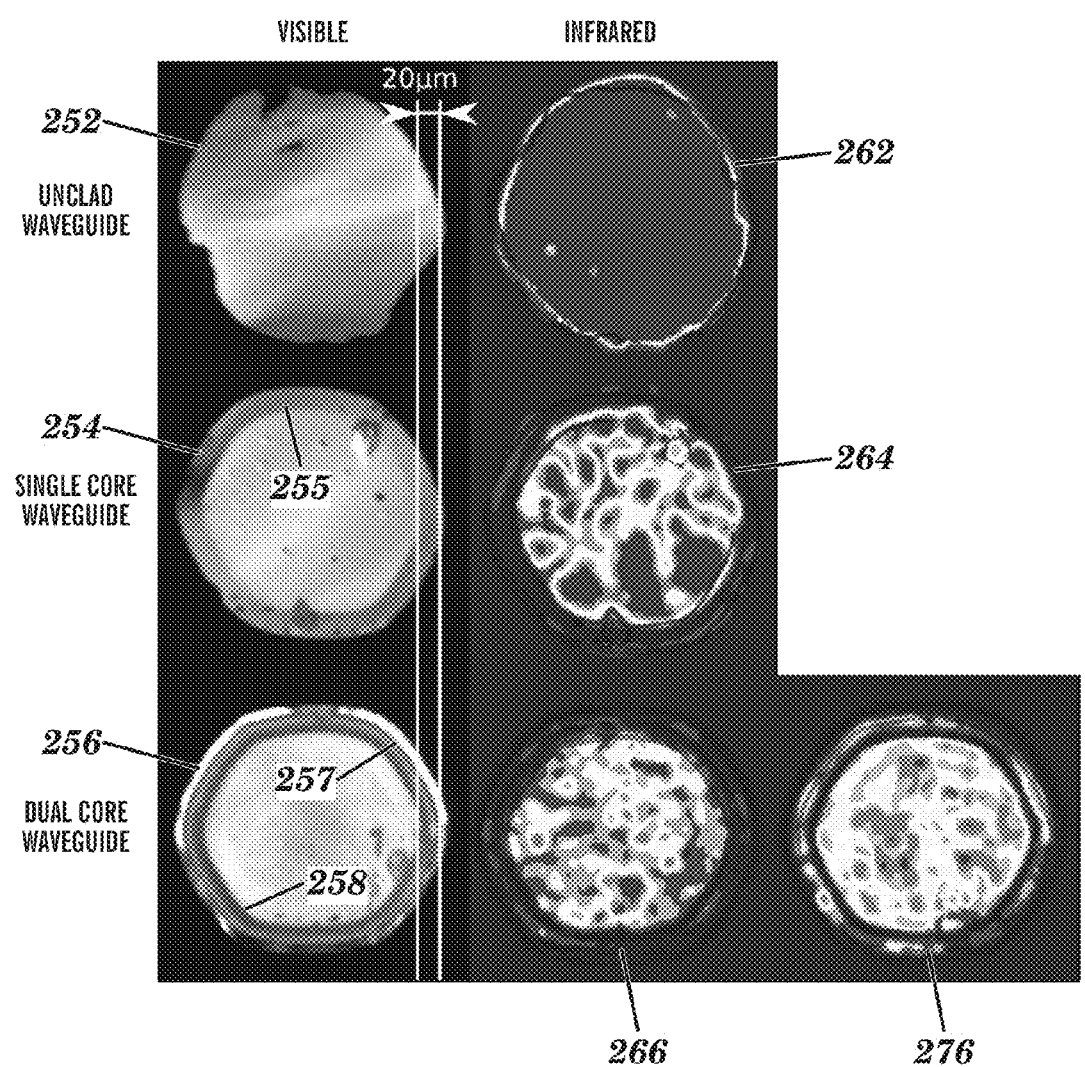
FIG. 14 presents images of examples of the radiation transmitted by actual fibers according to aspects of the invention compared to the prior art.

FIG. 14 presents images of examples of the radiation transmitted by actual fibers according to aspects of the invention compared to the prior art. FIG. 14 presents a series of images of the magnified ends of fibers and the radiation emitted from the ends of the fibers. Image 252 is an axial view of an end of a cylindrical fiber having no cladding about its periphery when transmitting visible light. As shown by image 252, the unclad fiber emits a relatively uniform distribution of light across the diameter of the fiber. Image 262 is an axial view of an end of the same cylindrical fiber having no cladding shown in Image 252 when transmitting infrared light. Again, as shown by image 262, the unclad fiber emits a relatively uniform distribution of infrared light across the diameter of the fiber. Images 254 and 264 show axial views of an end of a cylindrical fiber, similar to images 252 and 262, but having an ion implanted and annealed barrier 255 according to aspects of the present invention. Barrier 255 is approximately 20 μm from the surface of the fiber in images 254 and 264, which was the depth targeted. Image 254 illustrates the emission of visible light and image 264 illustrates the emission of infrared light. As shown by images 254 and 264, radiation is typically confined to the core of the fiber by barrier 255.

Images 256, 266, and 276 in FIG. 14 show axial views of an end of a cylindrical fiber, similar to images 254 and 264, but having two ion-implanted and annealed barriers 257 and 258 according to aspects of the present invention. Barrier 257 is approximately 9 μm from the surface of the fiber in images 256, 266, and 276, and barrier 258 is approximately 24 μm from the surface of the fiber in images 256, 266, and 276, which were the depths targeted. Image 256 illustrates the emission of visible light and images 266 and 276 illustrate the emission of infrared light. As shown by images 256 and 276, according to aspects of the invention, radiation can be confined to multiple regions in a waveguide or fiber, for example, a circular core region and an annular region about the core defined by barriers 257 and 258. Image 266 is similar to image 276; however, image 266 illustrates the emission of infrared light from substantially a core region only, while little or no infrared light is transmitted by the annular region outside the core. Among other things, images 266 and 276 illustrate how, according to aspects of the invention, multiple channels or waveguides can be provided in a single substrate and/or fiber for transmitting similar or different optical signals. In addition, three or more regions, for example, defined by a core region and two or more annular regions, in a single fiber or waveguide are envisioned.

Further aspects of the invention and experiments supporting the efficacy of aspects of the invention are disclosed in Spratt and Huang, et al. "Formation of optical barriers with excellent thermal stability in single-crystal," *Applied Physics Letters*, 99, 111909 (2011), the disclosure of which is incorporated by reference herein in its entirety. In this peer-reviewed paper, the inventors and their colleagues—under direction from the inventors—summarize their study of the use of hydrogen ion implantation to form optical barriers with excellent thermal stability in single-crystal sapphire substrates. Specifically, single-crystal sapphire crystals are implanted with H ions having energies ranging from about 0.2 MeV to about 1 MeV, and H ion doses ranging from about $10^{16}/cm^2$ to about $10^{17}/cm^2$, followed by thermal annealing between a range of about 600 to about 1200 degrees C. In addition, data from prism coupling experiments and spectroscopic ellipsometry are presented which indicate the formation of an optical barrier with decreased refractive index around the projected range of H ions in sapphire. The refractive index reduction is found to increase with annealing temperatures, reaching a maximum of about 3.2% reduction following annealing at 1200 degrees C. The correlation of the structural properties with the formation of optical barriers and their thermal stability in sapphire crystals is also discussed.

It is instructive to compare aspects of the present invention, for example, with respect to sapphire crystal fibers, with prior art teachings concerning buried planar waveguides fabricated using ion implantation. In the case of buried planar waveguides reported in the literature, optical barriers formed by ion implantation are positioned along the direction perpendicular to the sample surface and, accordingly, light cannot be confined in the lateral direction unless additional mechanisms are employed (for example, etching or sputtering to physically limit the lateral dimension). Another disadvantage of prior art planar waveguides is that light is guided within the ion irradiated regions, which would incur additional optical losses due to crystal damage and/or defects present in the ion irradiated regions. These disadvantages of the prior art are overcome by aspects of the present invention.

In contrast to the prior art, aspects of the present invention for embedded waveguides, for example, in sapphire optical fibers, for electromagnetic radiation, for example, light, can be confined, for instance, tightly confined, in the fiber or wafer core region as a result of the close loop structure of optical barriers produced by charged particle implantation, for example, H-ion implantation, from fiber or wafer sidewalls. Another important factor leading to minimal optical loss in aspects of the present invention is that the fiber or wafer core region, which is below the implanted region, remains substantially structurally unchanged or intact during charged particle implantation due to its depth greater than the projected range of implanted charged particles, such as, H ions. Accordingly, it is believed that aspects of the present invention may be much more advantageous and effective compared to prior art methods of providing barriers and waveguides for electromagnetic radiation.

Concerning the limits and ranges of parameters disclosed herein, it is to be understood that certain parameters, for example, temperatures, pressures, energies, and doses, among others, are disclosed as representative aspects of the invention, but aspects of the invention are not limited to these specific limits and ranges, but encompass limits and ranges within and beyond these ranges. For example, though aspects of the invention may include the limitation of greater than 200 degrees C., or greater than 500 degrees C., or greater than 1000 degrees C., it is to be understood that that other aspects of the invention may comprise any temperature above and beyond these limits and ranges, for example, greater than 300 degrees C., 350 degrees C., 400 degrees C. . . . 550 degrees C., 600 degrees C., 700 degrees C. . . . 1100 degrees C., and/or 1300 degrees C., among others.

The present invention, in its several embodiments and many aspects, provides several unique advantages and technological breakthroughs compared to the existing art. First, aspects of the present invention provide barriers to electromagnetic radiation, including optical barriers, in fibers, for example, single-crystal sapphire fibers, that are realized through structural modifications below the surface of the fiber material, for example, relatively deep in the bulk fiber material. Accordingly, the resultant barrier or cladding structures can be very stable in terms of thermal, mechanical, and chemical properties under harsh sensing conditions. This contrasts to conventional, prior art methods and fibers that may be based upon deposition/synthesis of dissimilar materials as claddings. In those prior art methods, differences in thermal expansion between newly formed materials and fiber matrices and chemical erosion of cladding materials due to direct exposure to chemically reactive environments, among other things, are great concerns under harsh sensing conditions.

Second, aspects of the present invention allow for the tailoring of optical parameters at desired locations within fiber matrices. This is particularly useful for controlling waveguiding modes in fibers, for example, sapphire fibers, by permitting the tuning of the size of fiber cores with the choice of charged particle energy, for example, H ion energy, among other parameters. In aspects of the invention, the embedded cladding structures can help significantly reduce the number of waveguiding modes in fibers, which is desirable in, for example, fiber-optics sensing. Furthermore, aspects of the invention may provide particular cladding configurations for special sensing applications, such as, double-cladding structures and even single-mode fibers, such a, single-mode sapphire fibers which are substantially impossible to fabricate with existing methods.

Third, the charged particle implantation employed by aspects of the invention is a mature technology that is frequently used for high-volume materials processing. In addition to the methods and apparatus provided for fiber and wafer claddings, aspects of the invention can also be applied to make fiber gratings in fibers and wafers. That is, aspects of the invention provide a cost-effective solution to fabricate fiber- and wafer-based sensors for harsh environment sensing.

As disclosed herein, the present invention comprises barriers, waveguides, and methods for fabricating barriers and waveguides that overcome the disadvantages of the prior art. As will be apparent to those of skill the art, the present invention, in all its embodiments and aspects, addresses a critical issue encountered in the development of enabling technologies for optical fiber, in particular, on single-crystal sapphire optical fibers, for harsh condition sensing. Aspects of the invention, provide viable and cost-effective solutions to achieving thermally, mechanically, and chemically stable barriers and claddings for electromagnetic radiation transmitting waveguides, for example, in optical fibers, under harsh conditions involved in various industrial processes, especially, for industrial combustion processes. Aspects of the invention markedly advance harsh environment sensing technologies.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method of fabricating an electromagnetic radiation barrier, the method comprising:
    directing a stream of charged particles into a substrate, the substrate at least partially transparent to the electromagnetic radiation, the charged particles modifying a crystal structure beneath a surface of the substrate; and
    heating the substrate to a temperature greater than 200 degrees C. wherein the charged-particle-modified crystal structure is annealed and provides a barrier to passage of at least some of the electromagnetic radiation.

2. The method as recited in claim 1, wherein heating the substrate to the temperature greater than 200 degrees C. comprises heating the substrate to a temperature greater than 500 degrees C.

3. The method as recited in claim 2, wherein heating the substrate to the temperature greater than 500 degrees C. comprises heating the substrate to a temperature greater than 1000 degrees C.

4. The method as recited in claim 1, wherein the charged particles comprise ions.

5. The method as recited in claim 4, wherein the ions comprise at least one of hydrogen ions and helium ions.

6. The method as recited in claim 1, wherein the substrate comprises an aluminum oxide substrate.

7. The method as recited in claim 1, wherein modifying the crystal structure comprises introducing voids to the crystal structure.

8. The method as recited in claim 1, wherein substrate comprises one of a polygonal cylindrical substrate and a circular cylindrical substrate.

9. An electromagnetic radiation barrier comprising a region beneath a surface of a substrate, the substrate at least partially transparent to the electromagnetic radiation, and the region having a refractive index different from the refractive index of the bulk substrate at a temperature greater than 200 degrees C.

10. The electromagnetic radiation barrier as recited in claim 9, wherein the temperature greater than 200 degrees C. comprises a temperature greater than 500 degrees C.

11. The electromagnetic radiation barrier as recited in claim 10, wherein the temperature greater than 500 degrees C. comprises a temperature greater than 1000 degrees C.

12. The electromagnetic radiation barrier as recited in claim 9, wherein the substrate comprises an aluminum oxide substrate.

13. A method of fabricating an optical barrier, the method comprising:
    directing a stream of charged particles into a single-crystal sapphire substrate, the charged particles modifying a crystal structure beneath a surface of the single-crystal sapphire substrate; and
    heating the single-crystal sapphire substrate to a temperature greater than 200 degrees C. wherein the charged-particle-modified crystal structure is annealed and provides a barrier to passage of at least some optical radiation.

14. The method as recited in claim 13, wherein the method further comprises rotating the single-crystal sapphire substrate.

15. The method as recited in claim 14, wherein rotating the single-crystal sapphire substrate is practiced while directing the stream of charged particles into the single-crystal sapphire substrate.

16. The method as recited in claim 15, wherein the single-crystal sapphire substrate comprises a circular cylindrical substrate, and wherein rotating the single-crystal sapphire substrate comprises rotating the circular cylindrical single-crystal sapphire substrate about an axis of the circular cylindrical single-crystal sapphire substrate.

17. The method as recited in claim 13, wherein heating comprises heating the single-crystal sapphire substrate to a temperature greater than 500 degrees C.

18. The method as recited in claim 13, wherein heating comprises heating the single-crystal sapphire substrate to a temperature greater than 1000 degrees C.

19. The method as recited in claim 18, wherein heating comprises heating the single-crystal sapphire substrate to a temperature greater than 1500 degrees C.

20. The method as recited in claim 13, wherein directing the stream of charged particles into a single-crystal sapphire substrate comprises directing a first stream of charged particles having a first energy into the single-crystal sapphire substrate, wherein the method further comprises directing a second stream of charged particles having a second energy, different from the first energy, into the single-crystal sapphire substrate.

21. The method as recited in claim 1, wherein the electromagnetic radiation barrier comprises an optical waveguide.

22. The method as recited in claim 1, wherein the electromagnetic radiation barrier comprises optical cladding.

23. The electromagnetic radiation barrier as recited in claim 9, wherein the electromagnetic radiation barrier comprises an optical waveguide.

24. The electromagnetic radiation barrier as recited in claim 9, wherein the electromagnetic radiation barrier comprises optical cladding.

25. The method as recited in claim 13, wherein the optical barrier comprises an optical waveguide.

26. The method as recited in claim 13, wherein the optical barrier comprises optical cladding.

27. The electromagnetic radiation barrier as recited in claim 9, wherein the region beneath the surface of the substrate having the refractive index different from the refractive index of the bulk substrate comprises a region formed by directing charged particles to modify the crystal structure of the substrate in the region and then heating the substrate to a temperature greater than 200 degrees C. wherein the charged-particle-modified crystal structure in the region is annealed to provide the refractive index different from the refractive index of the bulk substrate.

28. The method as recited in claim 1, wherein the substrate comprises a crystalline substrate.

29. The method as recited in claim 28, wherein the crystalline substrate comprises a crystalline oxide substrate.

30. The method as recited in claim 29, wherein the crystalline oxide substrate comprises a single-crystal sapphire substrate.

31. The electromagnetic radiation barrier as recited in claim 9, wherein the substrate comprises a crystalline substrate.

32. The electromagnetic radiation barrier as recited in claim 31, wherein the crystalline substrate comprises a crystalline oxide substrate.

33. The electromagnetic radiation barrier as recited in claim 32, wherein the crystalline oxide substrate comprises a single-crystal sapphire substrate.

* * * * *